(12) United States Patent
Rahimo

(10) Patent No.: US 11,588,045 B2
(45) Date of Patent: Feb. 21, 2023

(54) FORTIFIED TRENCH PLANAR MOS POWER TRANSISTOR

(71) Applicant: mqSemi AG, Zug (CH)

(72) Inventor: Munaf Rahimo, Gaensbrunnen (CH)

(73) Assignee: MQSEMI AG, Zug (CH)

( * ) Notice: Subject to any disclaimer, the term of this patent is extended or adjusted under 35 U.S.C. 154(b) by 0 days.

(21) Appl. No.: 17/137,618

(22) Filed: Dec. 30, 2020

(65) Prior Publication Data

US 2021/0202724 A1 Jul. 1, 2021

(51) Int. Cl.
*H01L 29/739* (2006.01)
*H01L 29/10* (2006.01)

(52) U.S. Cl.
CPC ...... *H01L 29/7397* (2013.01); *H01L 29/1095* (2013.01)

(58) Field of Classification Search
CPC ............ H01L 29/7397; H01L 29/1095; H01L 29/0623; H01L 29/0696; H01L 29/4238; H01L 29/7396; H01L 29/7393; H01L 29/7801
See application file for complete search history.

(56) References Cited

U.S. PATENT DOCUMENTS

| | | | |
|---|---|---|---|
| 5,795,793 A | 8/1998 | Kinzer | |
| 5,986,304 A * | 11/1999 | Hshieh | H01L 29/7813 257/361 |
| 6,380,586 B1 | 4/2002 | Koshikawa | |
| 8,441,046 B2 | 5/2013 | Bobde | |
| 9,064,925 B2 | 6/2015 | Rahimo | |
| 9,093,522 B1 | 7/2015 | Zeng | |
| 9,461,127 B2 | 10/2016 | Zeng | |
| 9,640,644 B1 | 5/2017 | Chen | |
| 10,090,297 B2 | 10/2018 | Hikasa | |
| 2018/0261666 A1* | 9/2018 | Zeng | H01L 29/0878 |

OTHER PUBLICATIONS

Kang et al. "Trench emitter IGBT with lateral and vertical MOS channels" (Proc. 23rd Internat. Conf. on Microelectronics MIEL 2002, 163-166).
Zeng et al. "Numerical analysis of a trench VDMOST structure with no quasi-saturation" (Solid State Electronics, vol. 38, No. 4, p. 821-828, 1995).
Spulber et al. "A novel gate geometry for the IGBT: the trench planar insulated gate bipolar transistor (TPIGBT)" (IEEE Electron Device Letters, vol. 20, No. 11, Nov. 1999, p. 580).

* cited by examiner

*Primary Examiner* — Cuong B Nguyen
(74) *Attorney, Agent, or Firm* — Tarolli, Sundheim, Covell & Tummino LLP

(57) ABSTRACT

A MOS cell based on a simple and self-aligned process is provides a planar cell forming a horizontal MOS channel, and a plurality of trench regions, which are arranged at an angle with respect to the longitudinal direction of the planar cells. The new cell concept can adopt both planar MOS channels and Trench MOS channels in a single MOS cell structure, or planar MOS channels alone, while utilising the trenches to improve the current spreading of the planar MOS channels. Floating P-doped regions at the bottom of the trench regions protect the device against high peak electric fields. The orthogonal trench recesses are discontinued in their longitudinal direction to allow the planar channels to conduct electrons. The design can be applied to both IGBTs and MOSFETs based on silicon or wide bandgap materials.

19 Claims, 35 Drawing Sheets

Third embodiment according to this invention.

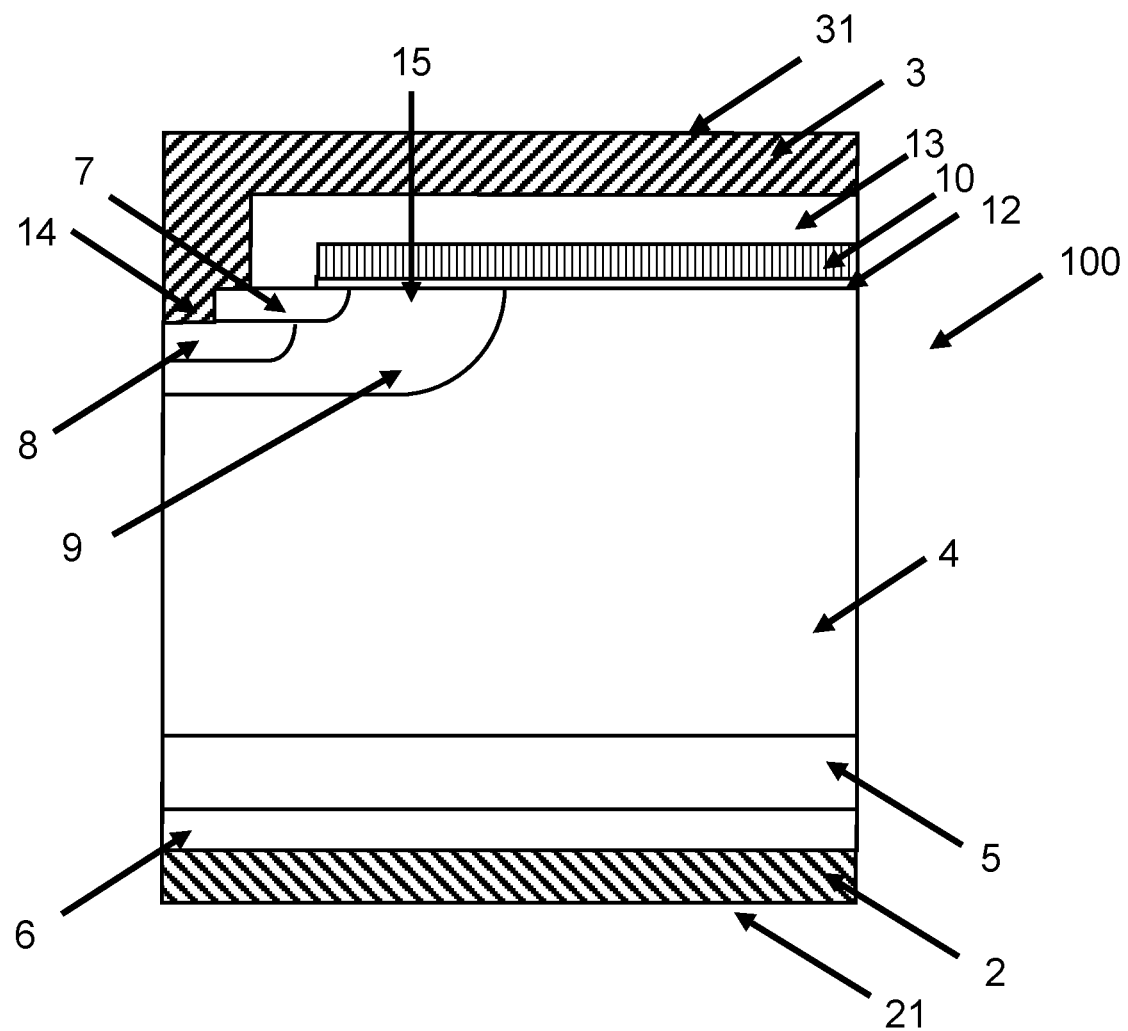
Figure (1A) Prior Art.

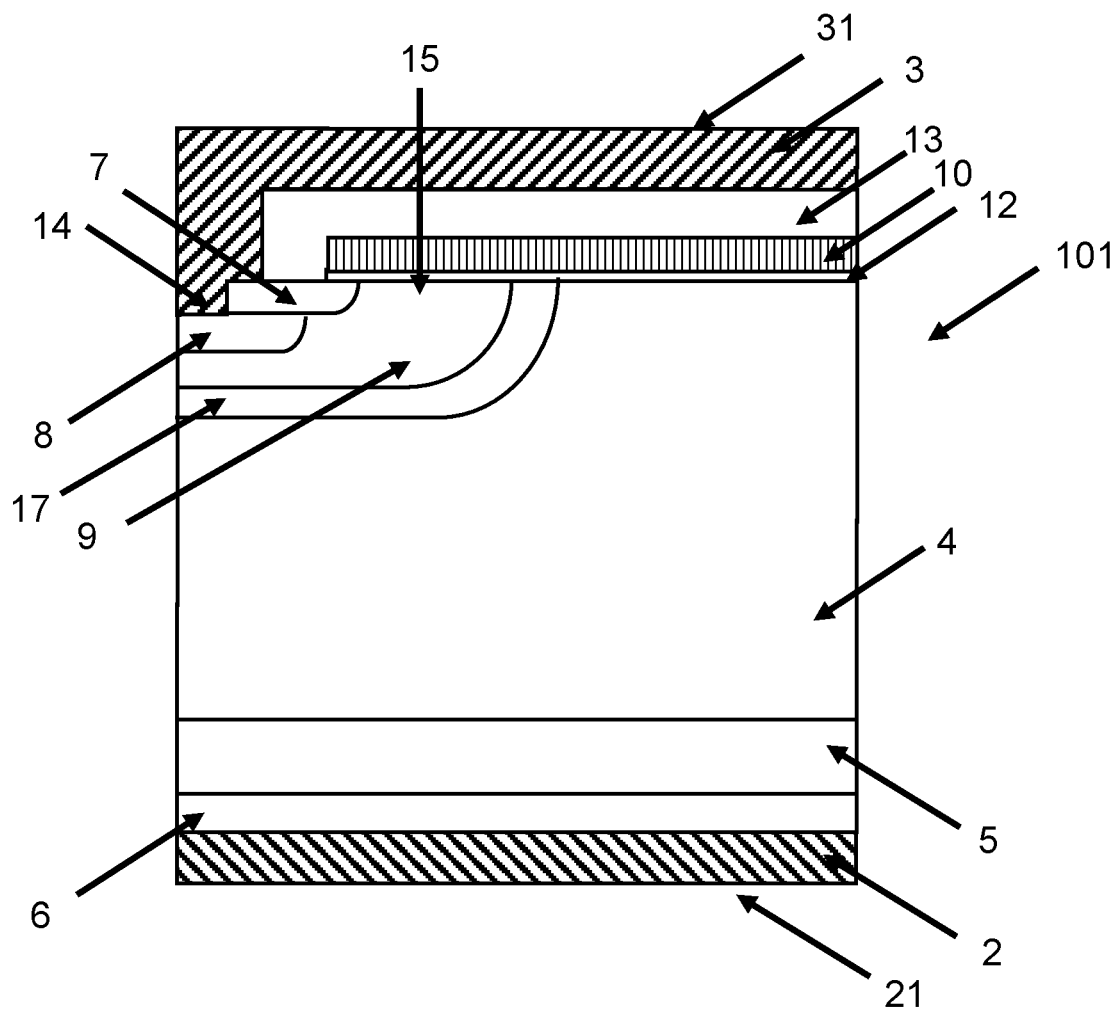
Figure (1B) Prior Art.

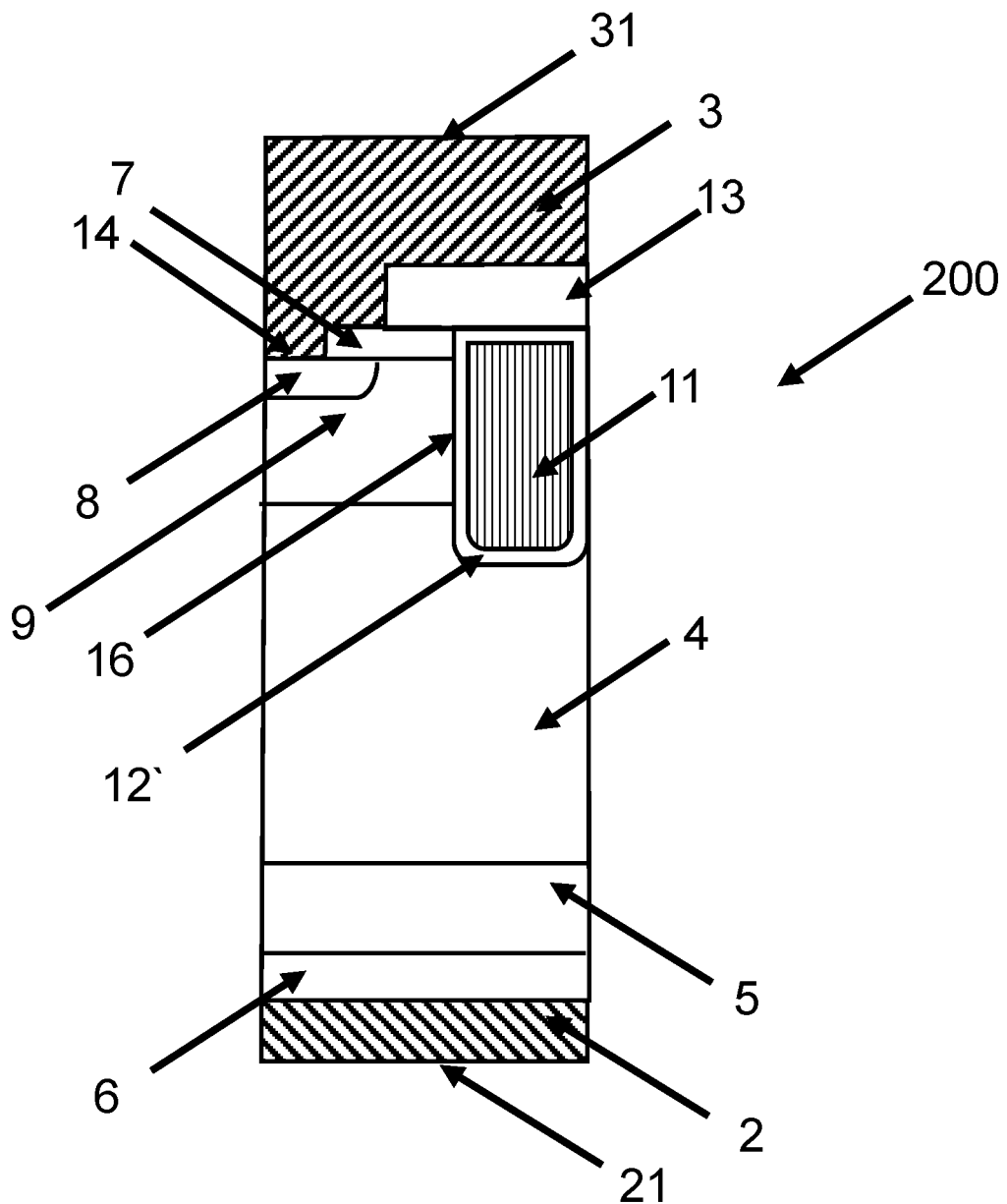
Figure (2A) Prior Art.

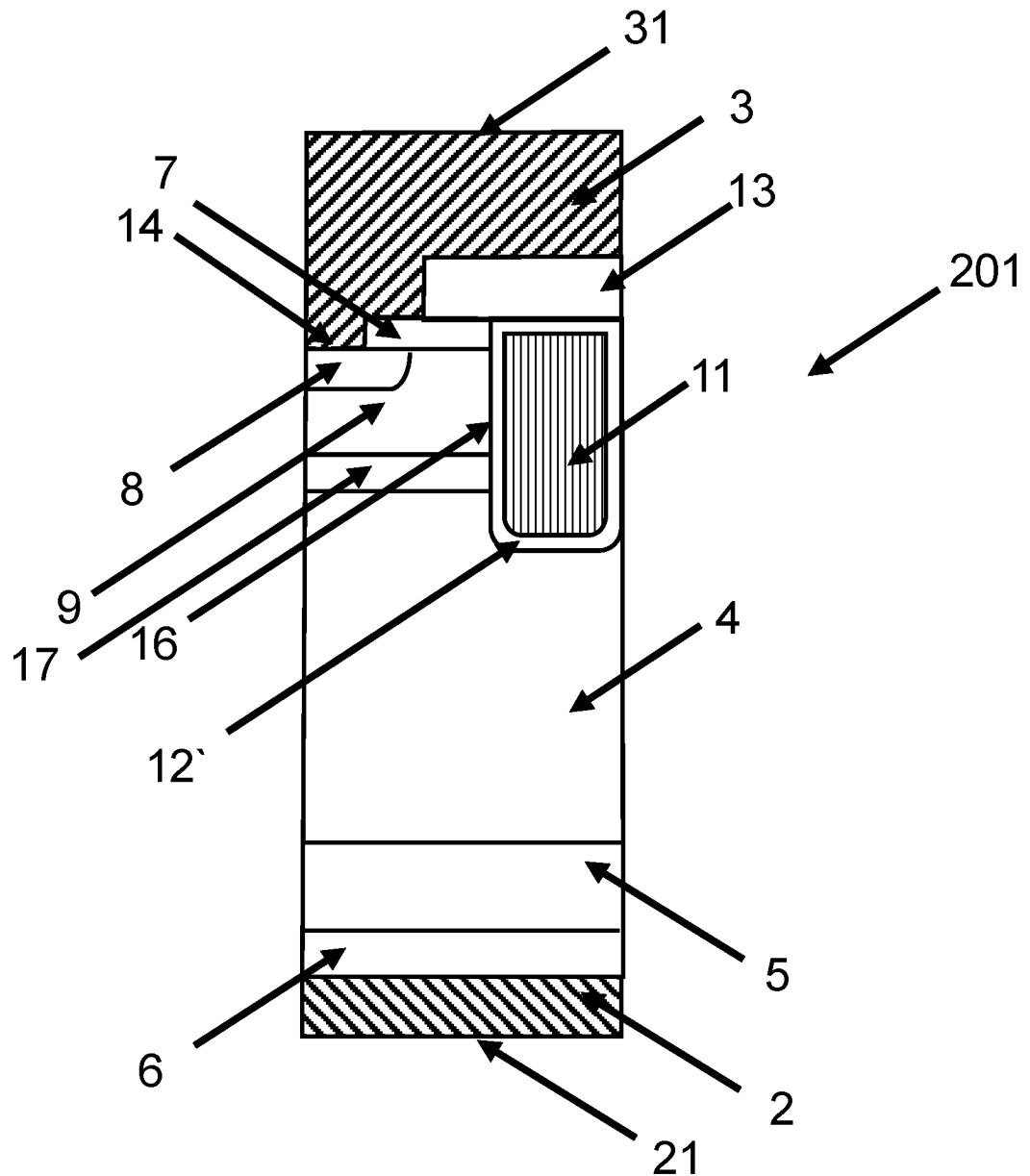
Figure (2B) Prior Art.

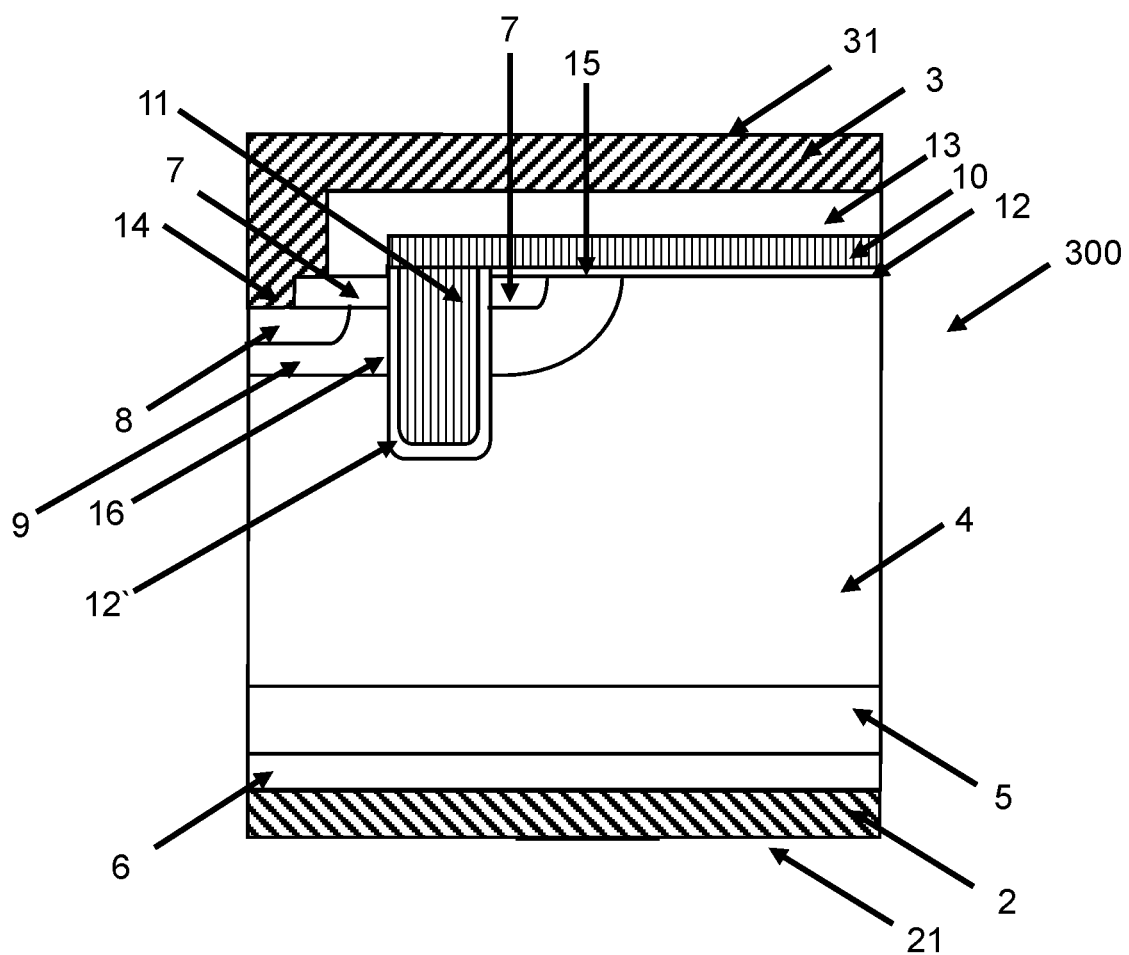
Figure (3) Prior Art.

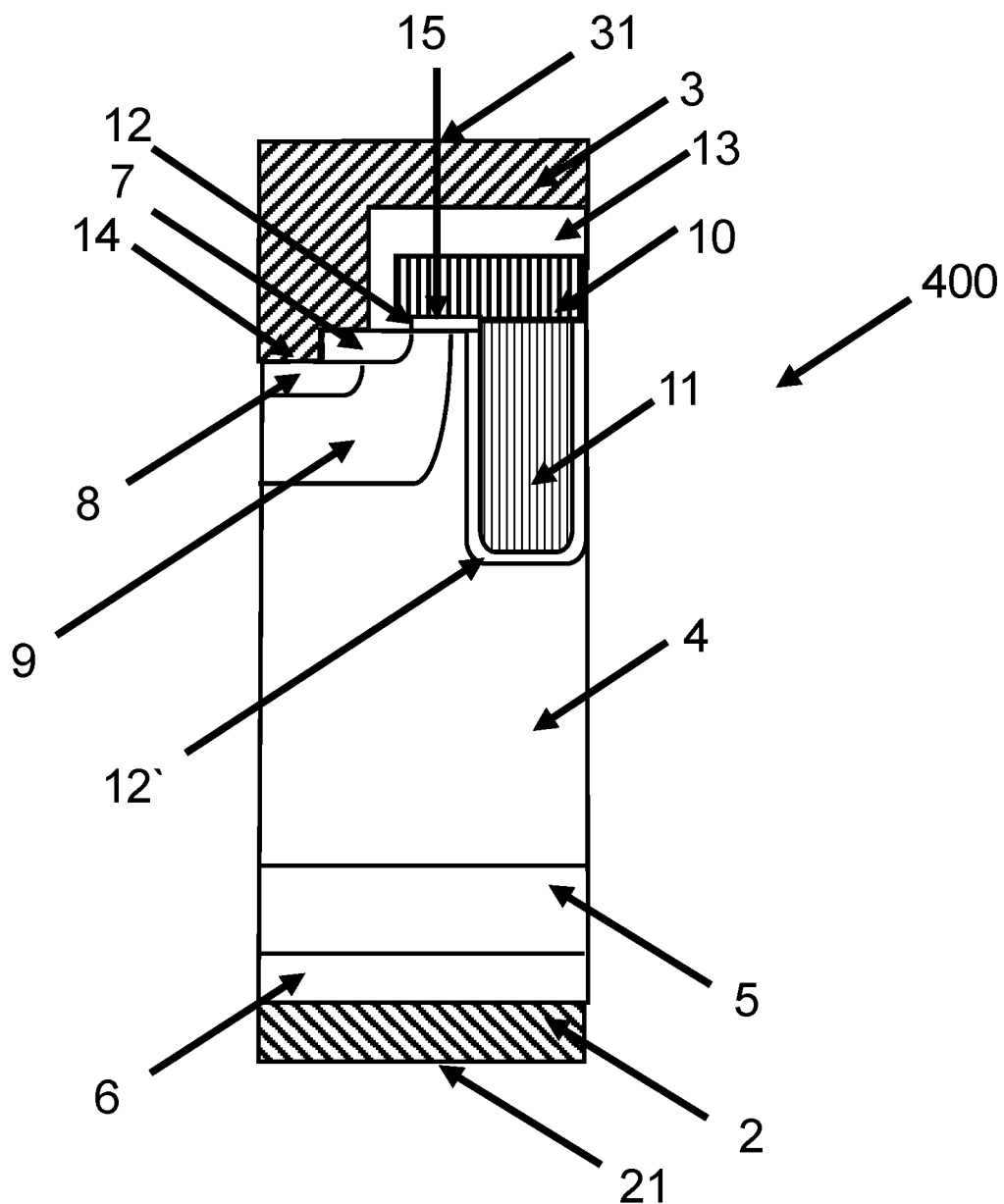
Figure (4A) Prior Art.

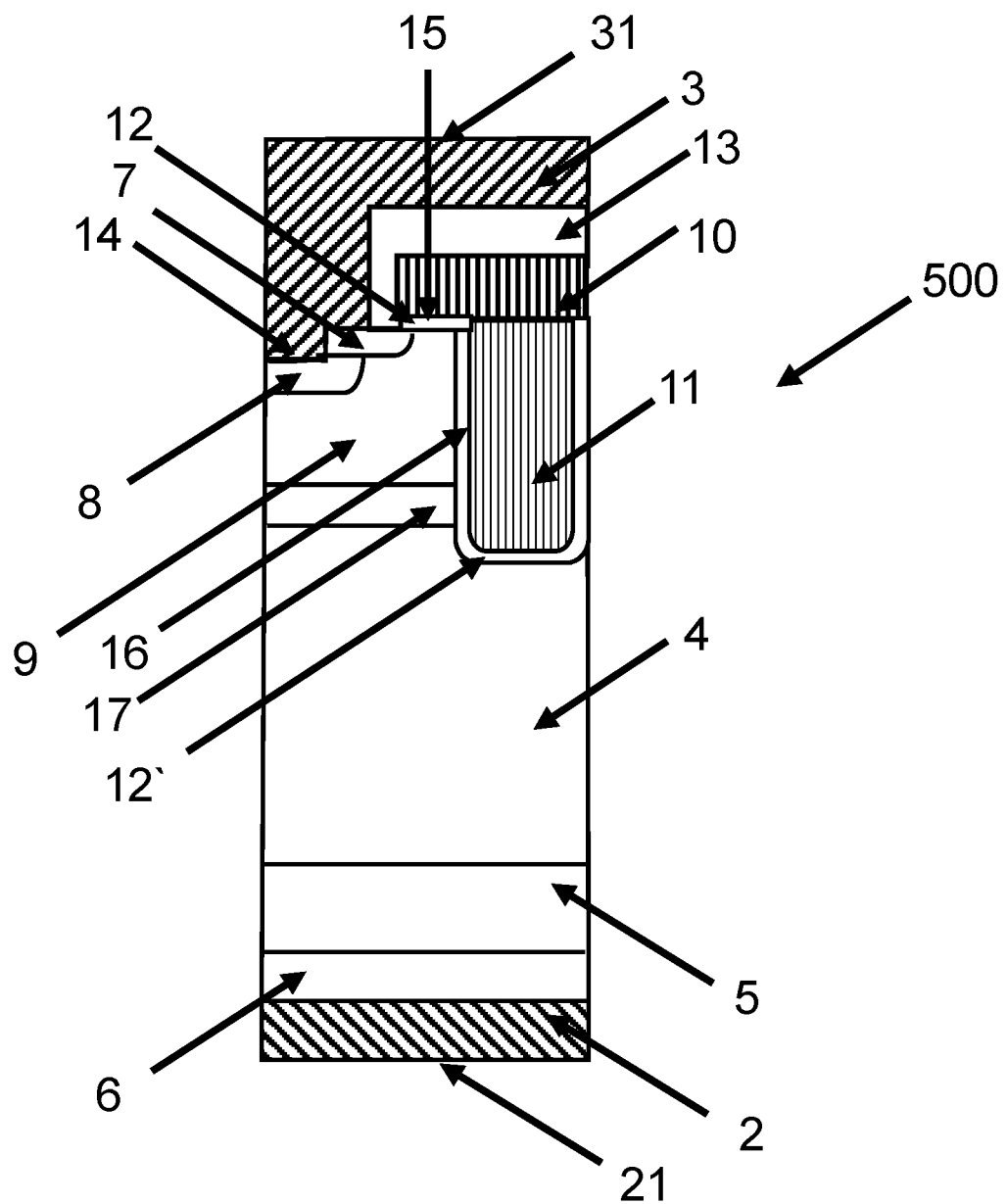
Figure (4B) Prior Art.

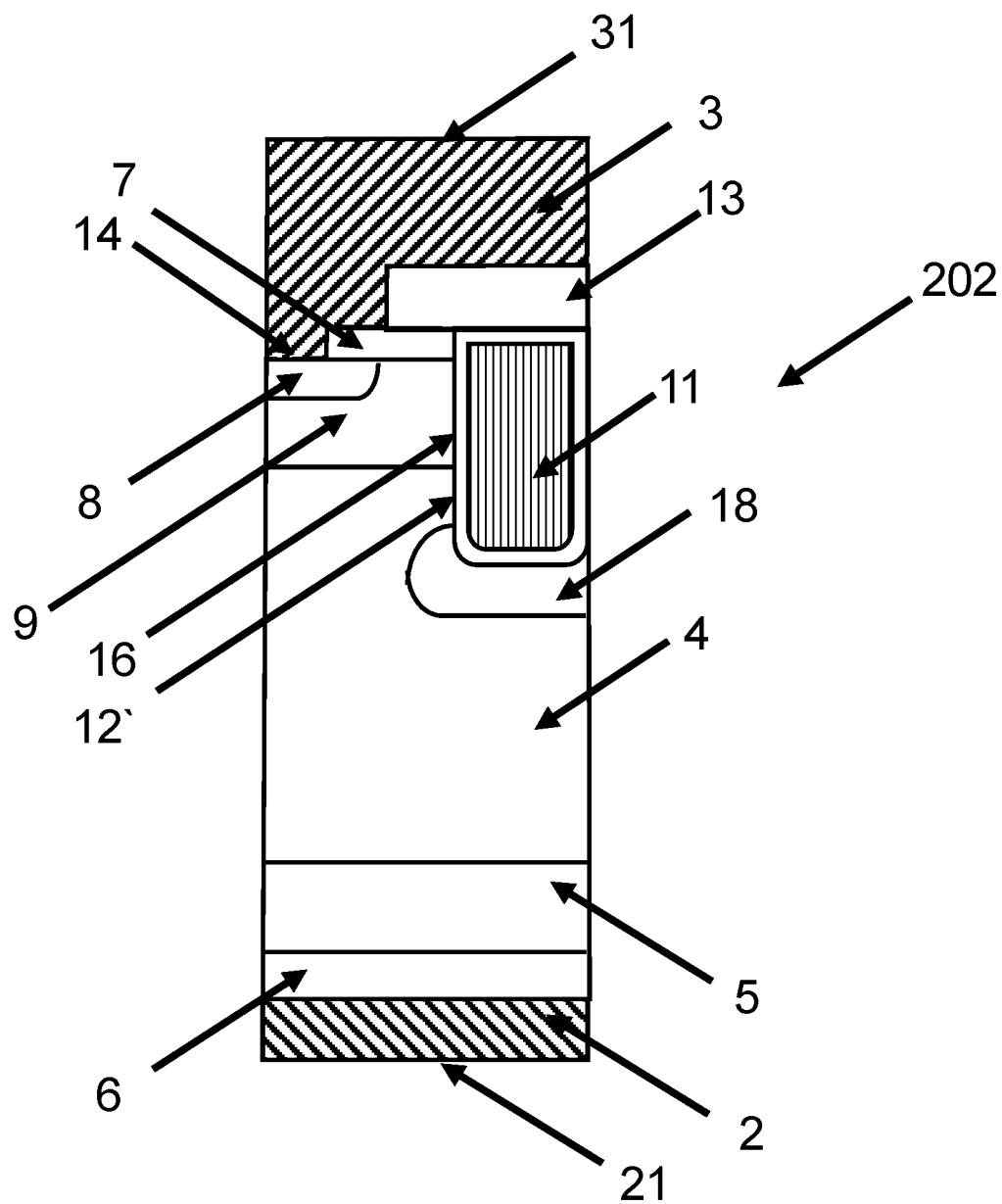
Figure (5) Prior Art.

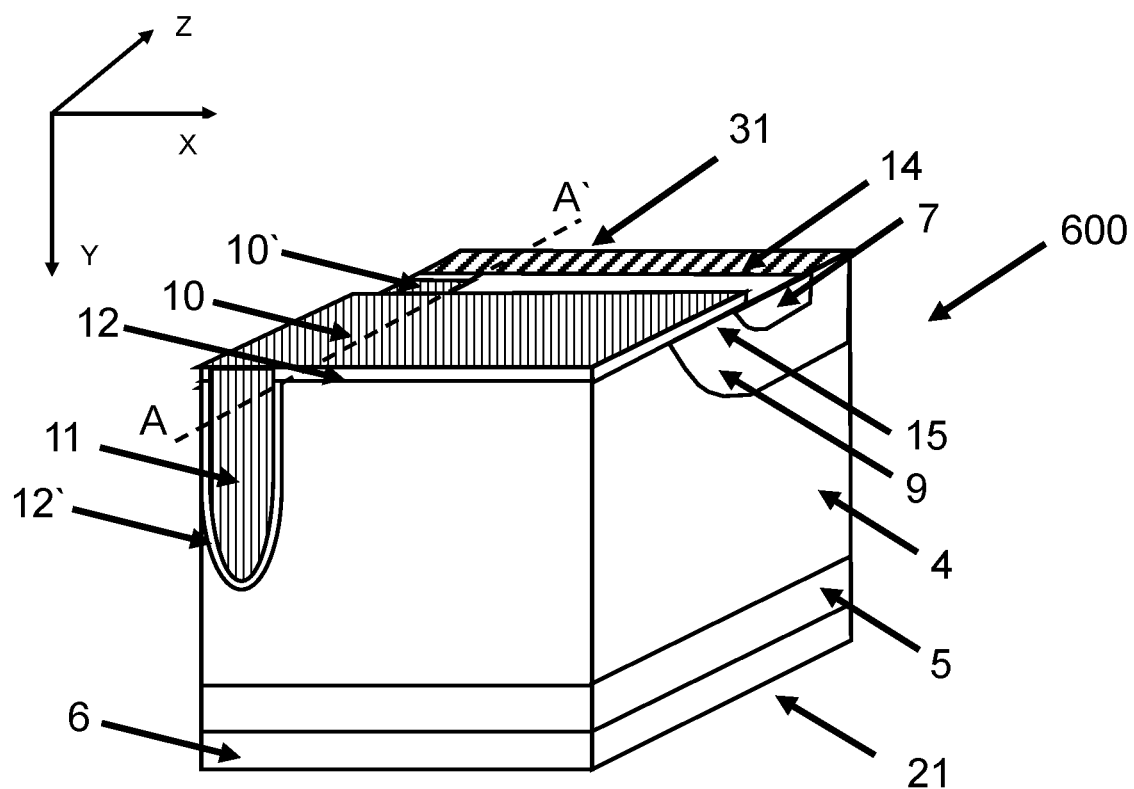
Figure (6A) Prior Art.

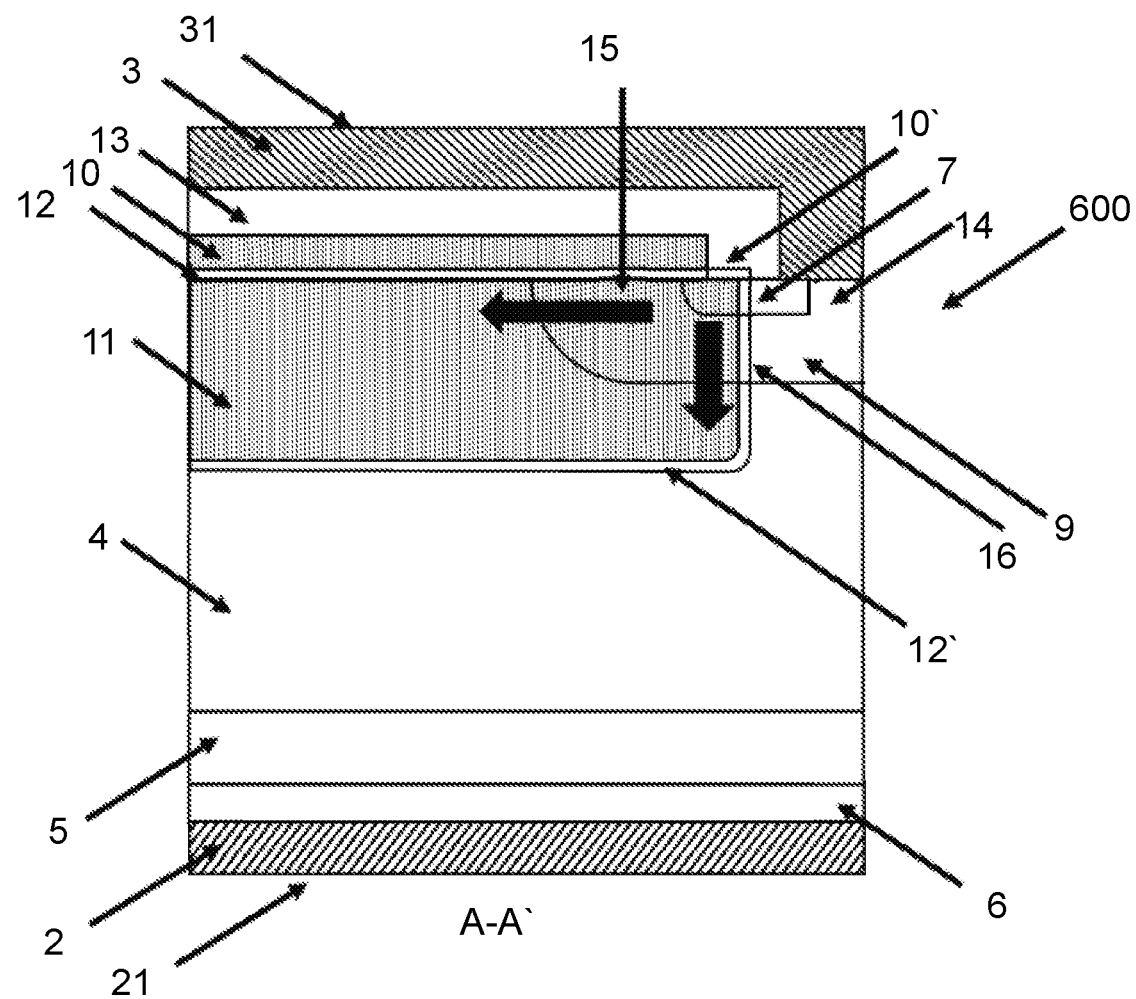
Figure (6B) Prior Art.

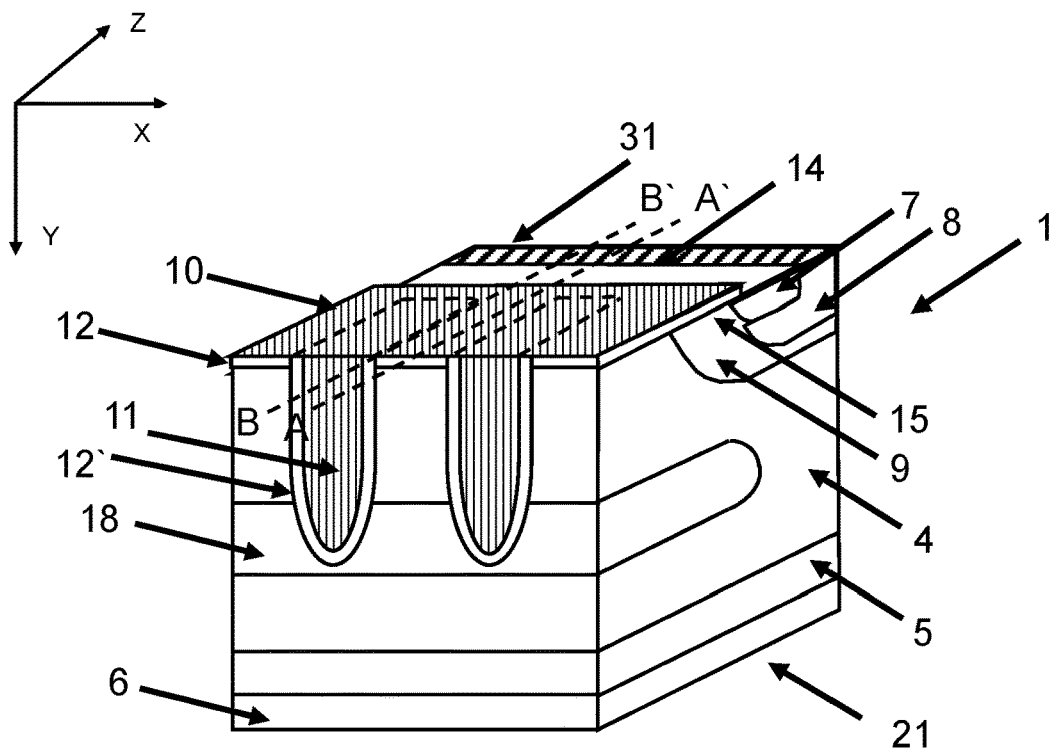
Figure (7) First embodiment according to this invention.
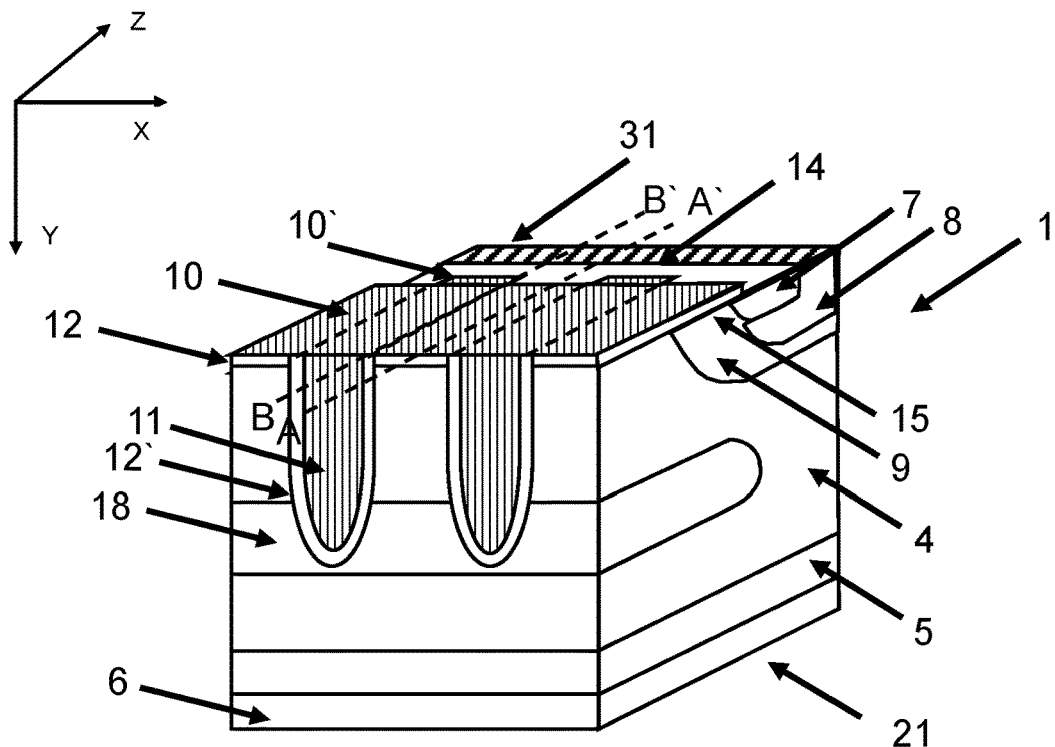
Figure (8) Second embodiment according to this invention.

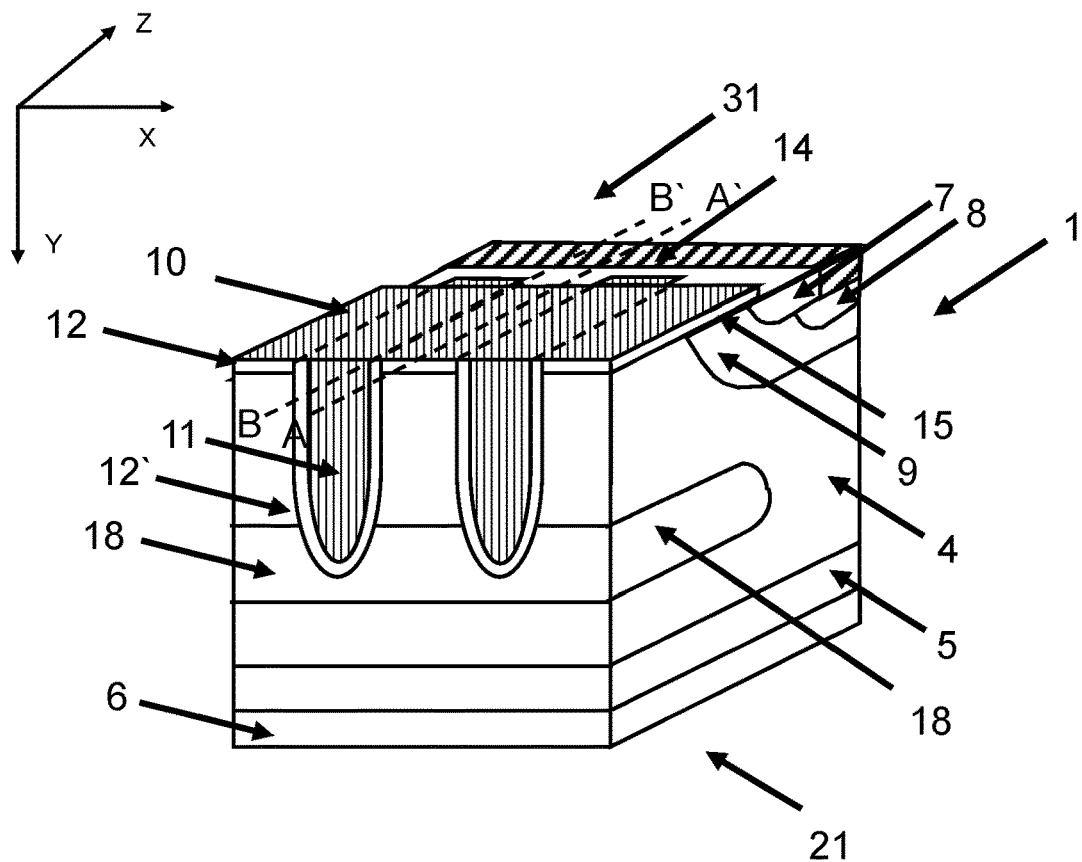
Figure (9) Third embodiment according to this invention.
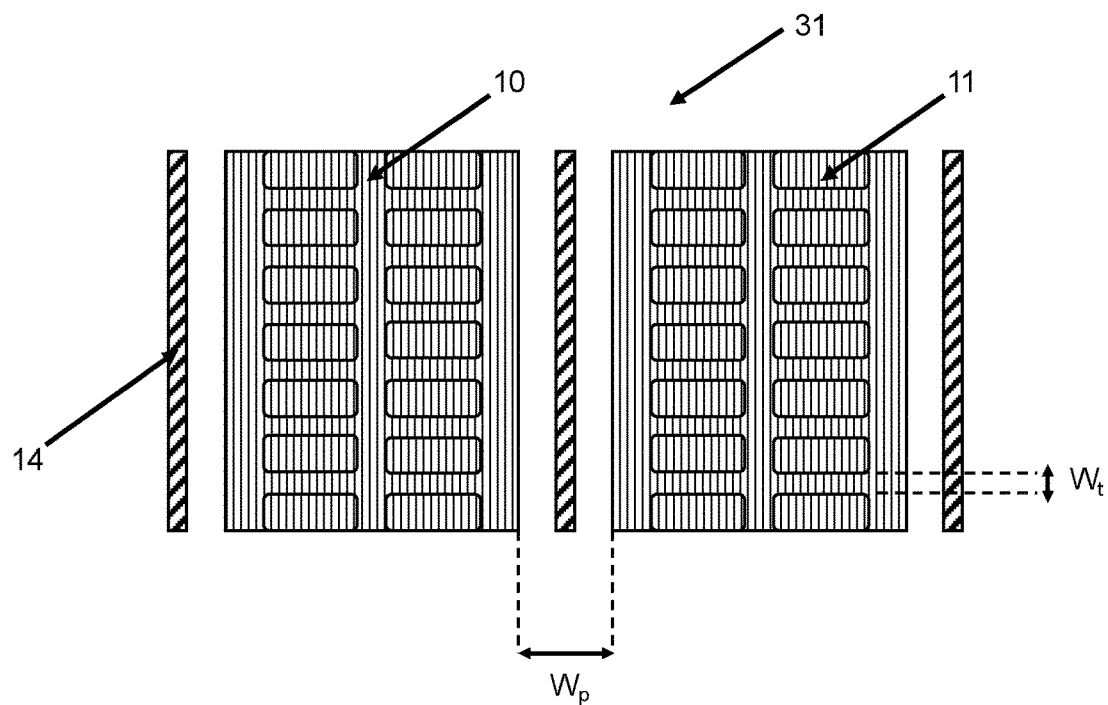
Figure (10)

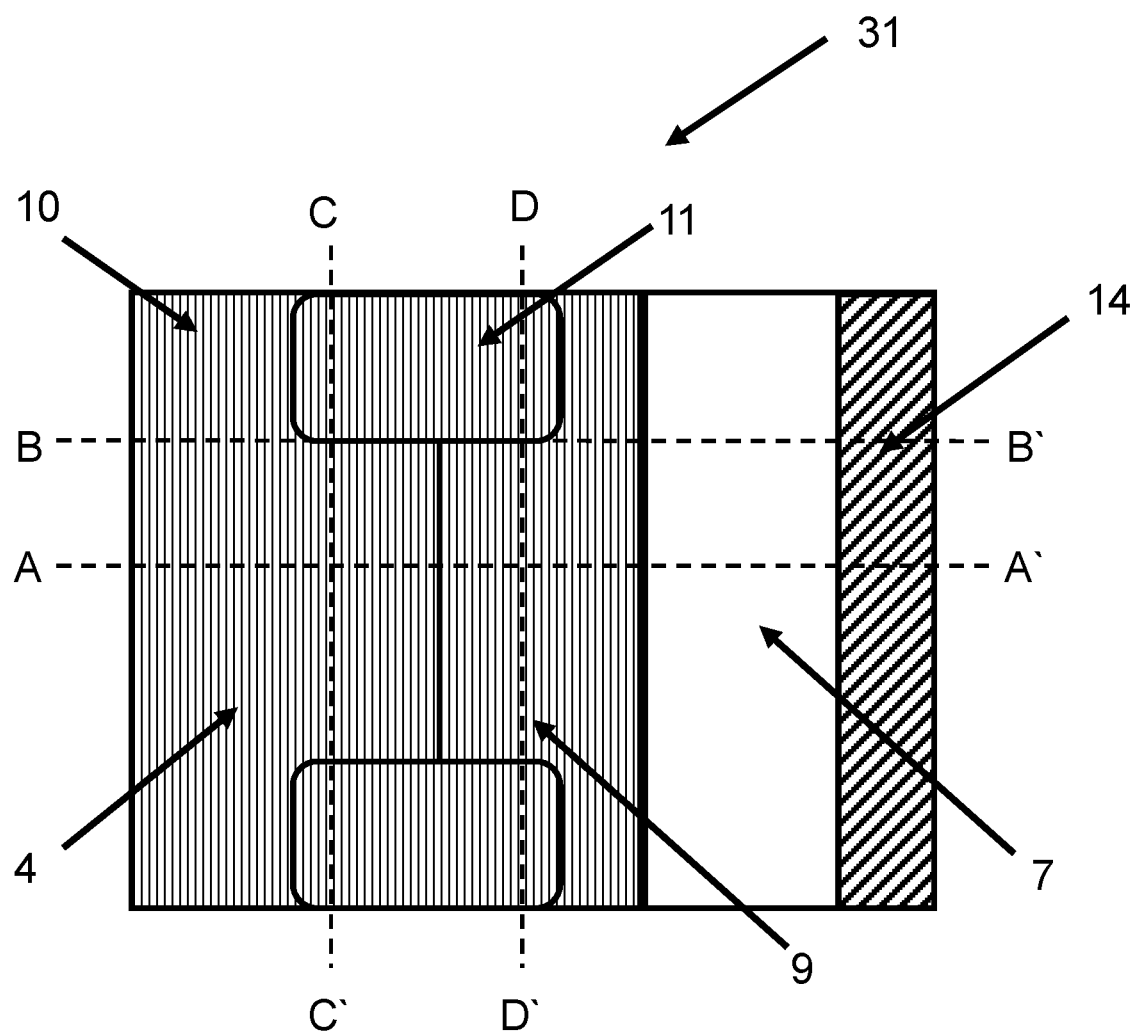
Figure (11A)

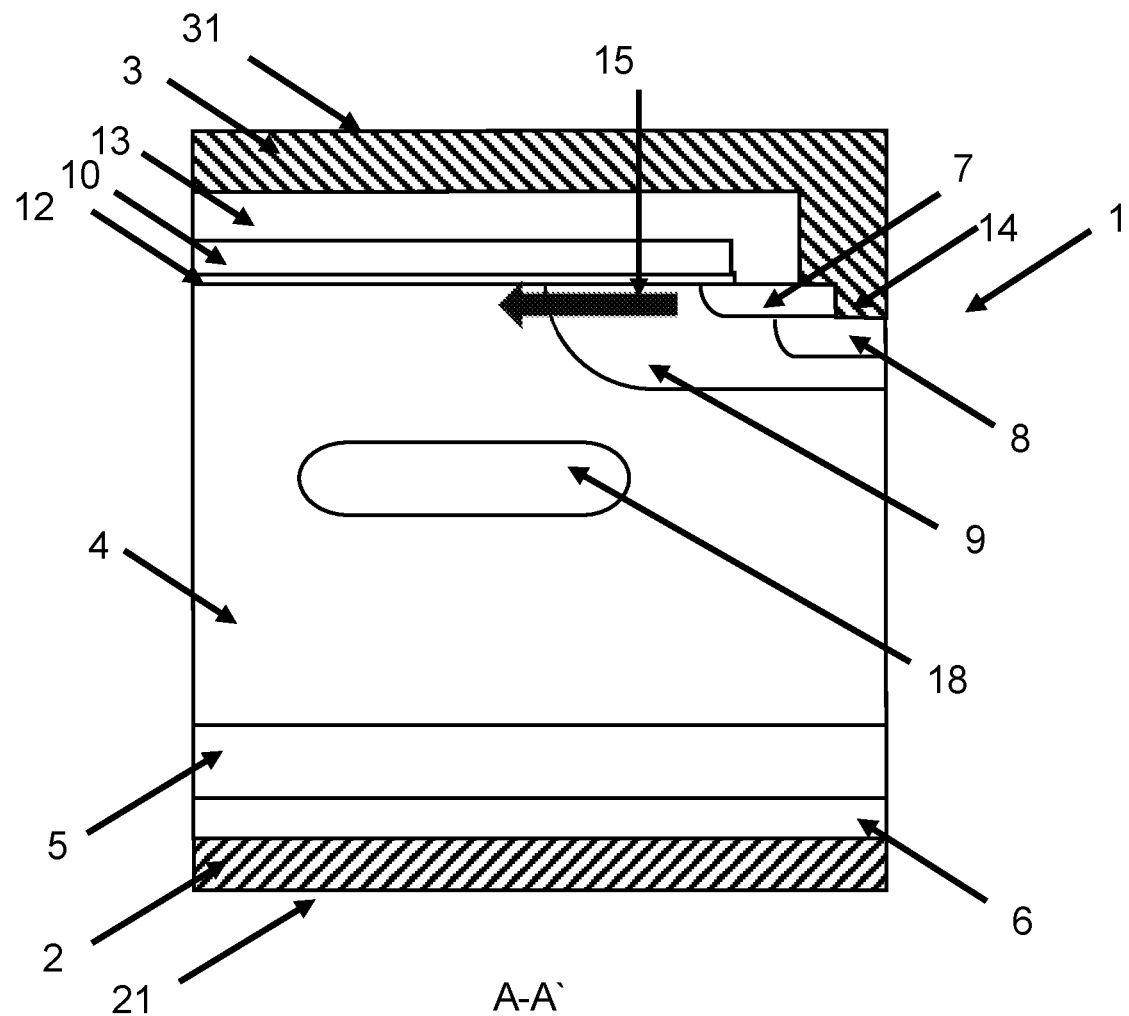
Figure (11B)

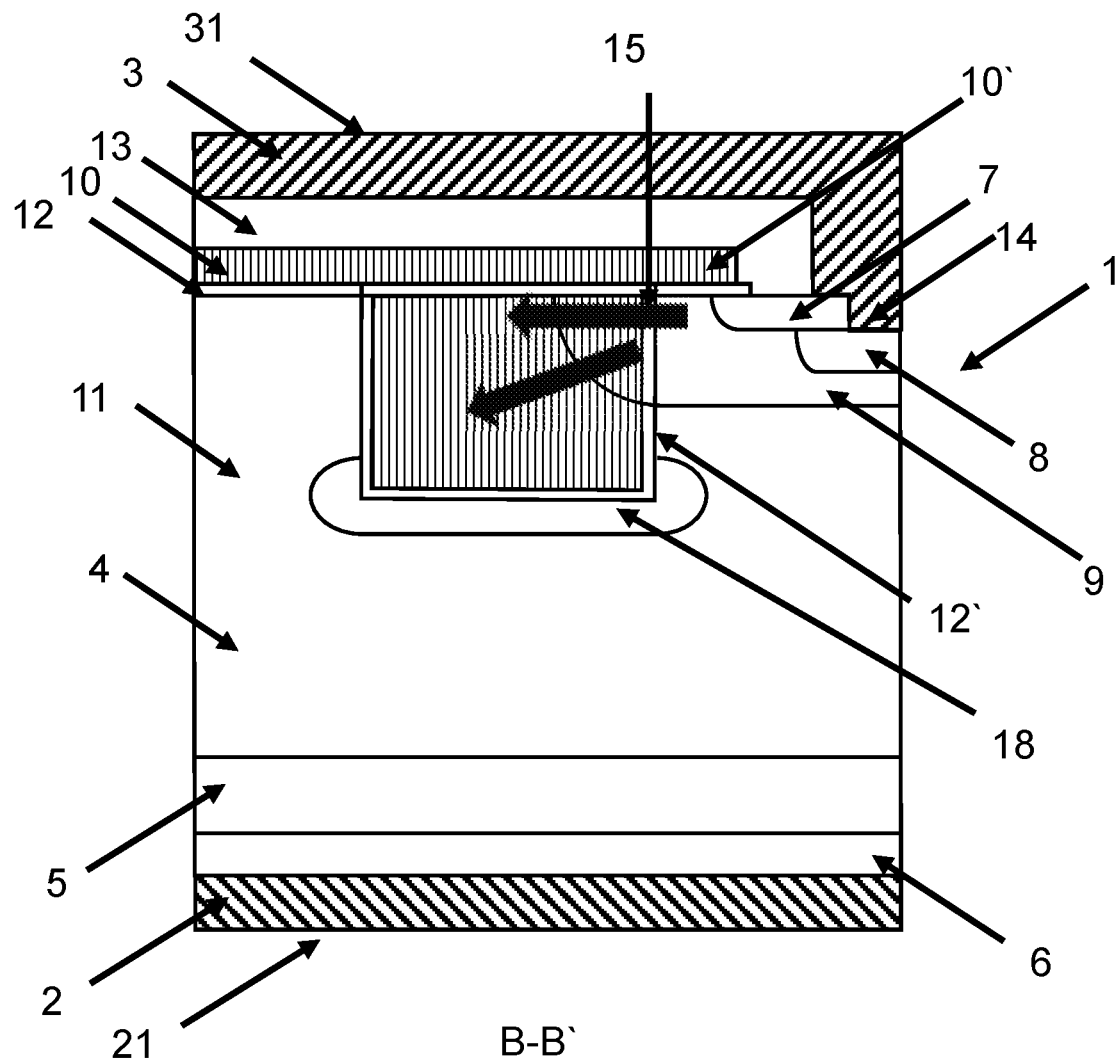
Figure (11C)

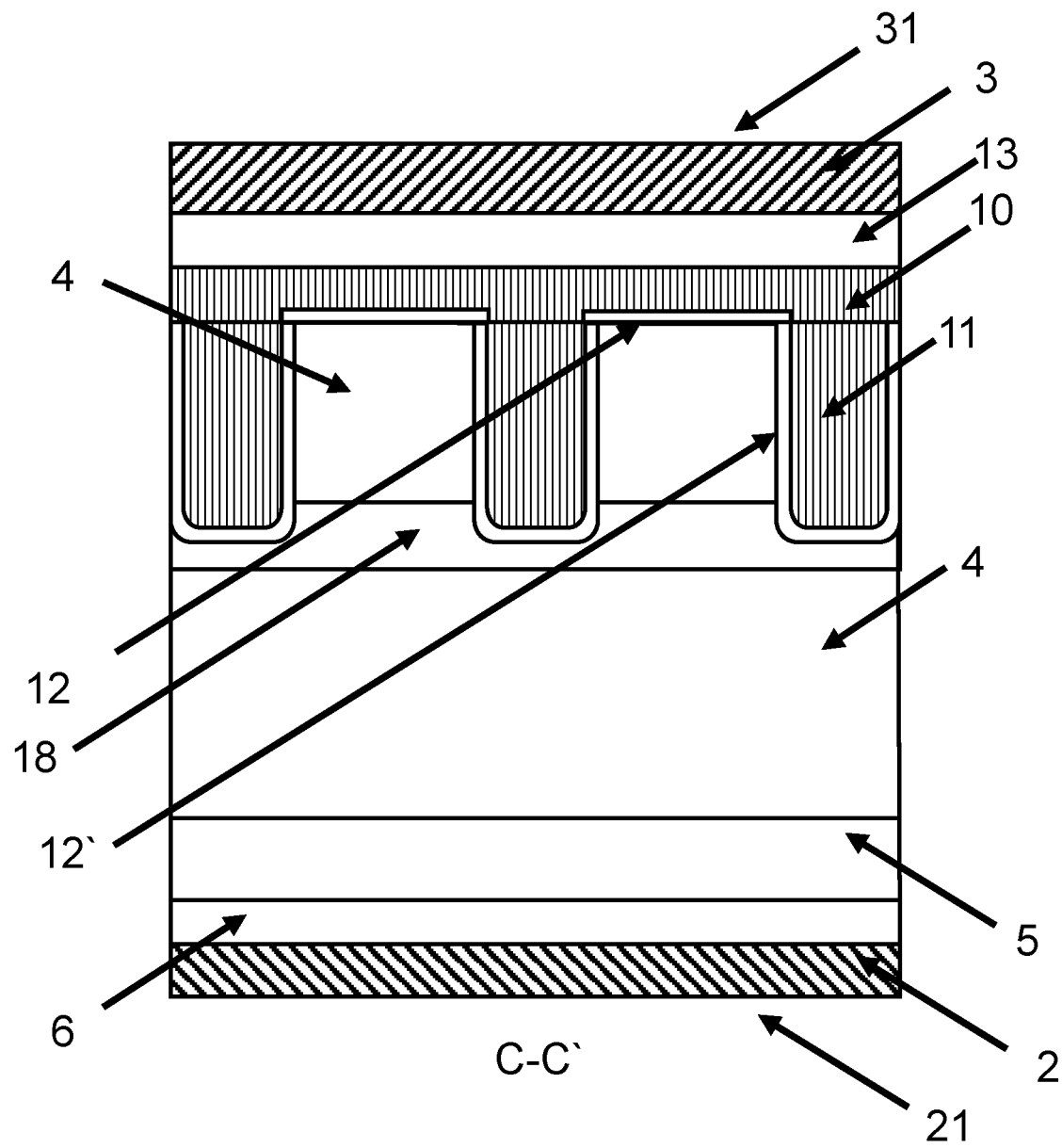
Figure (11D)

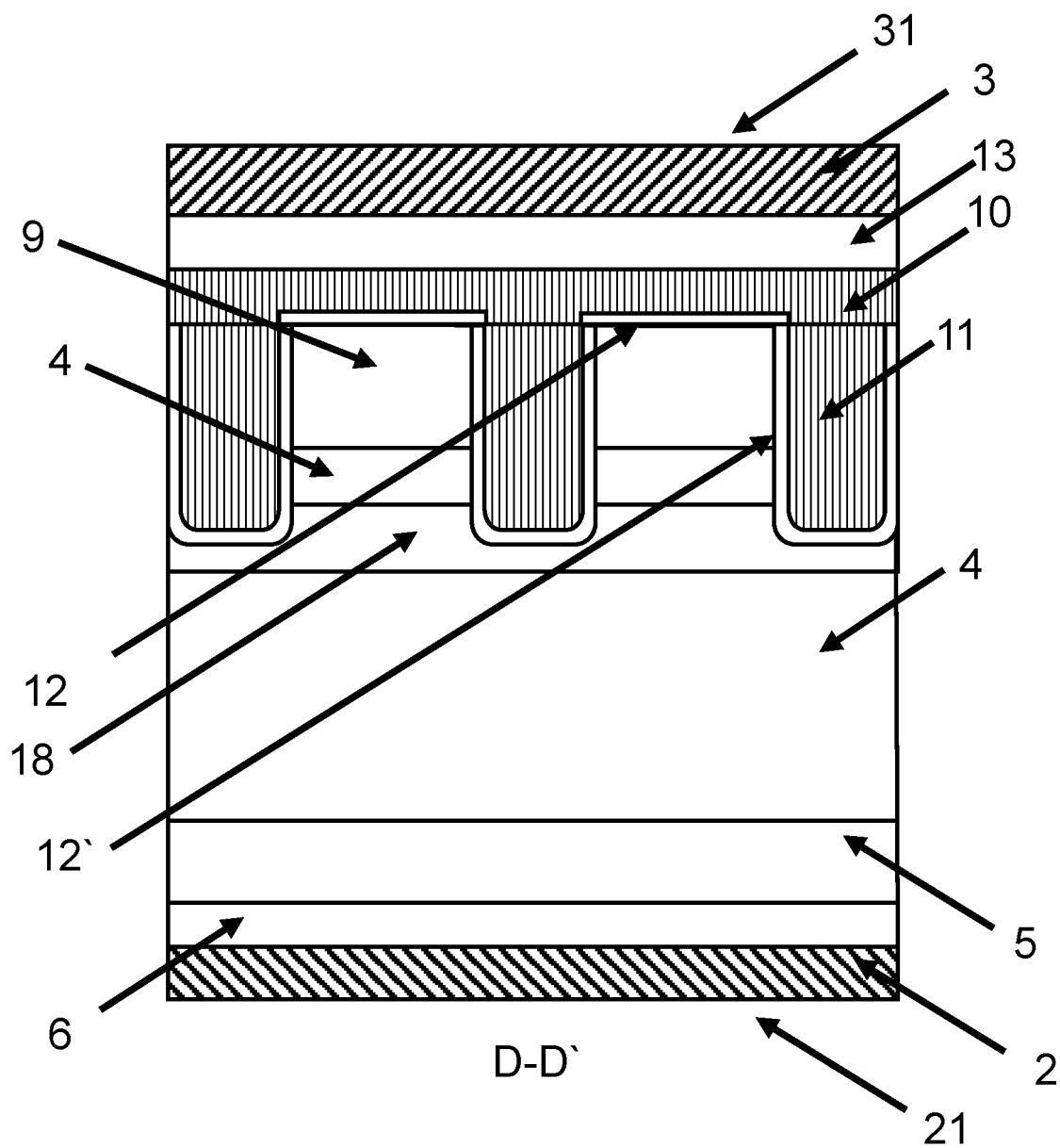
Figure (11E)

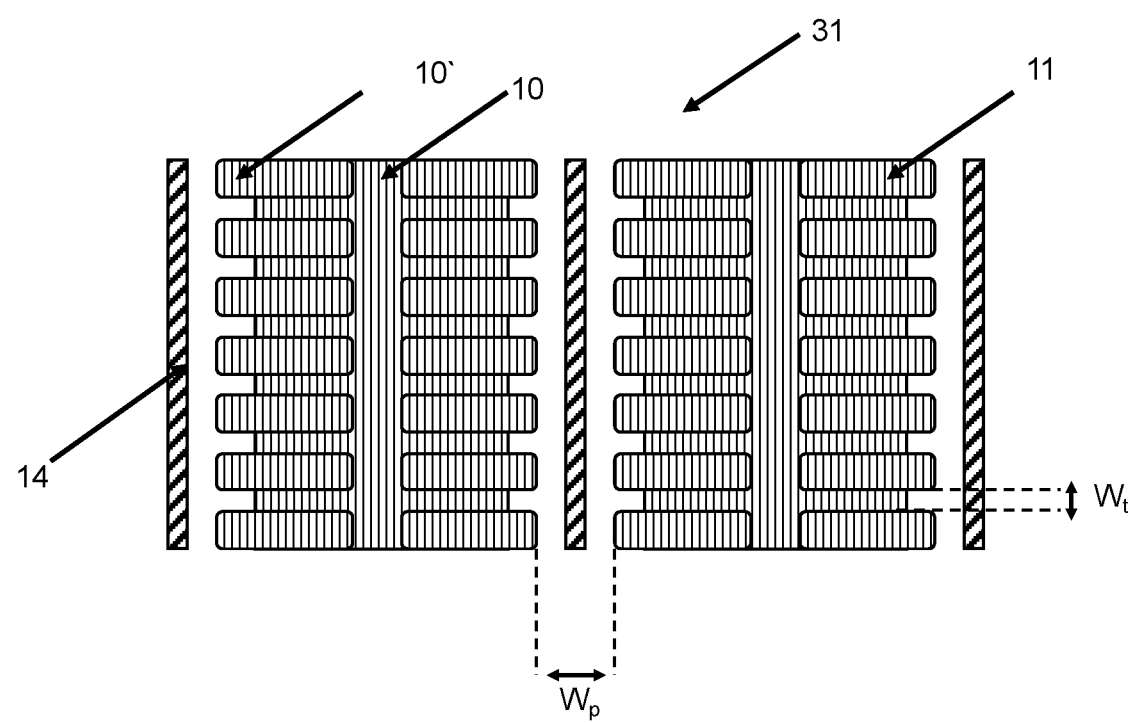
Figure (12)

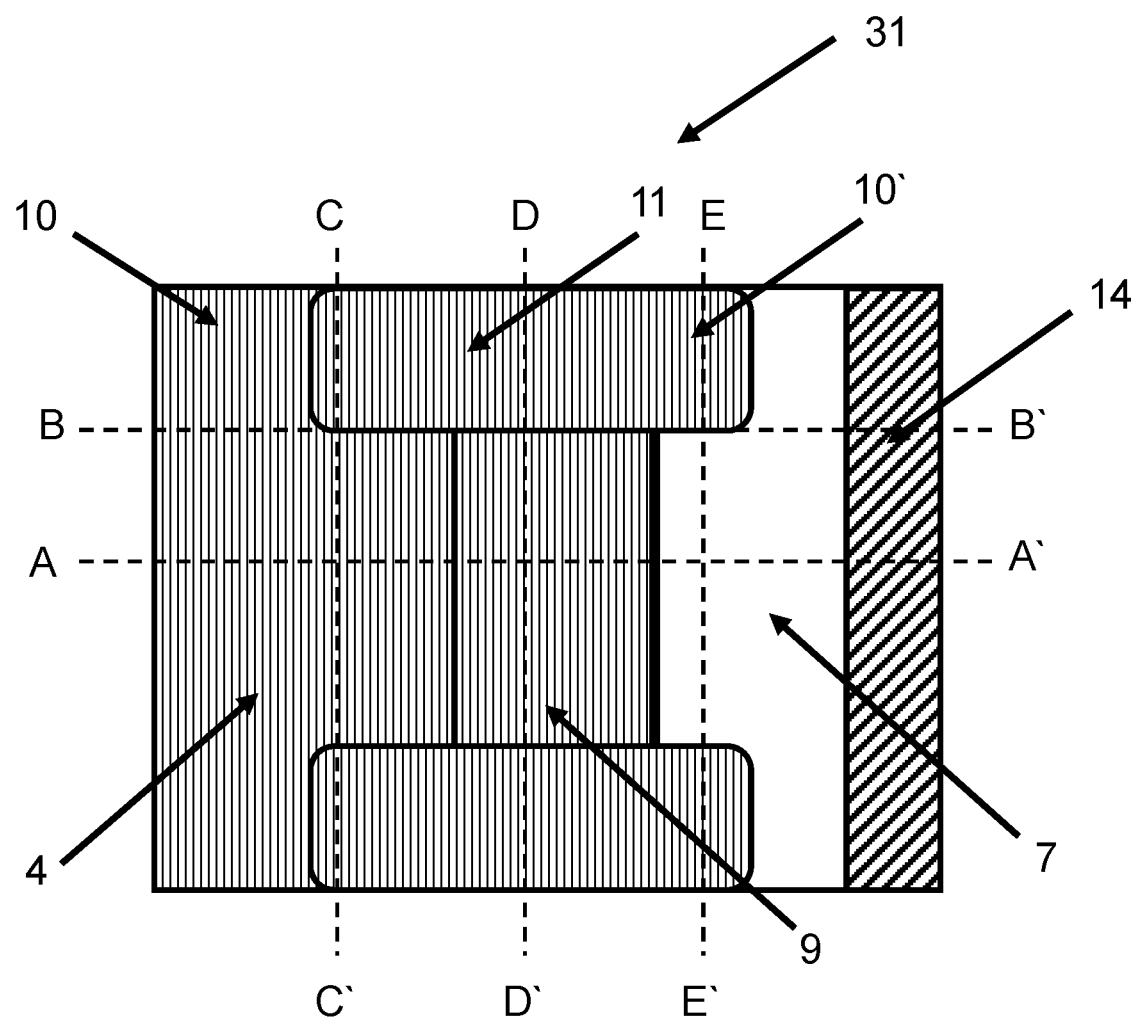
Figure (13A)

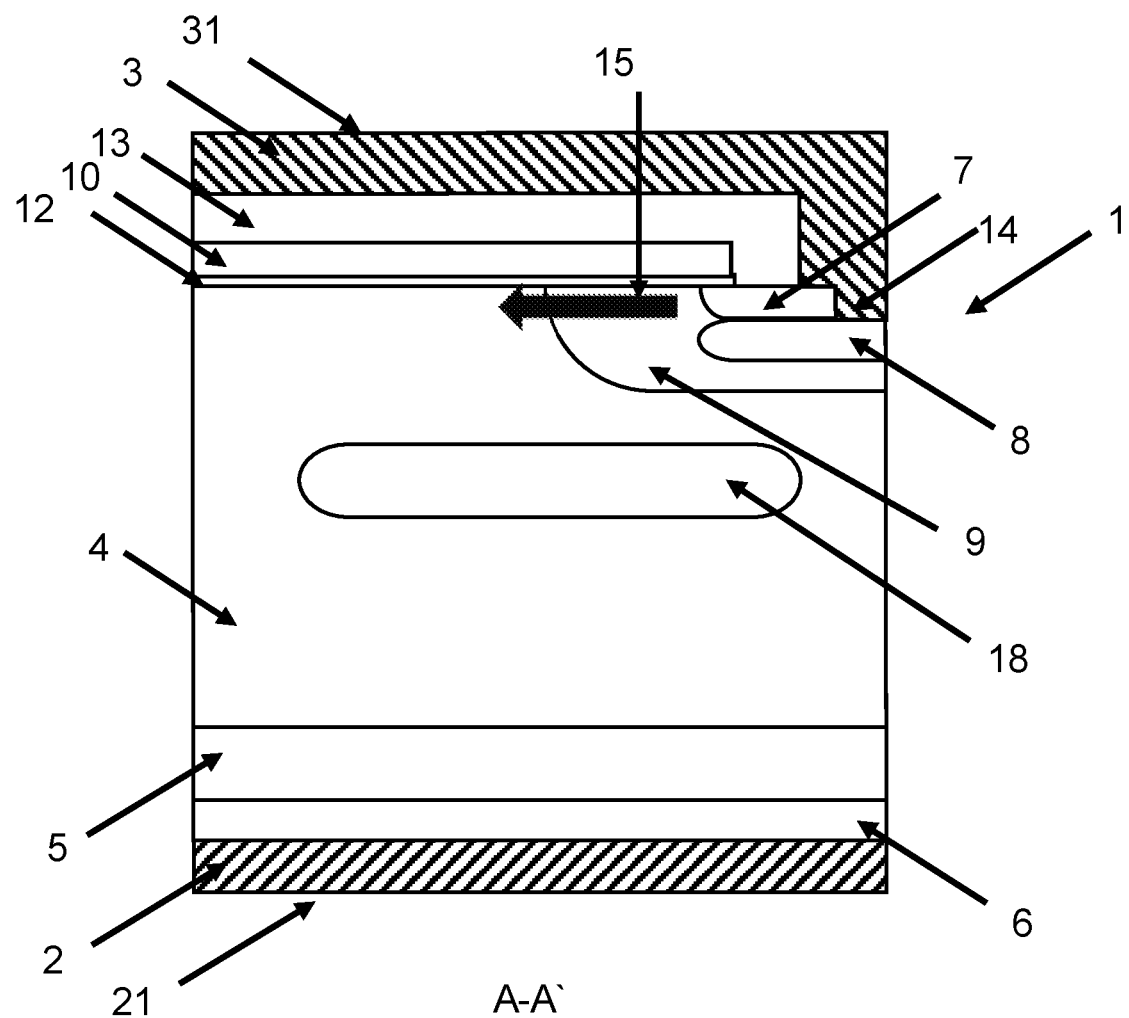
Figure (13B)

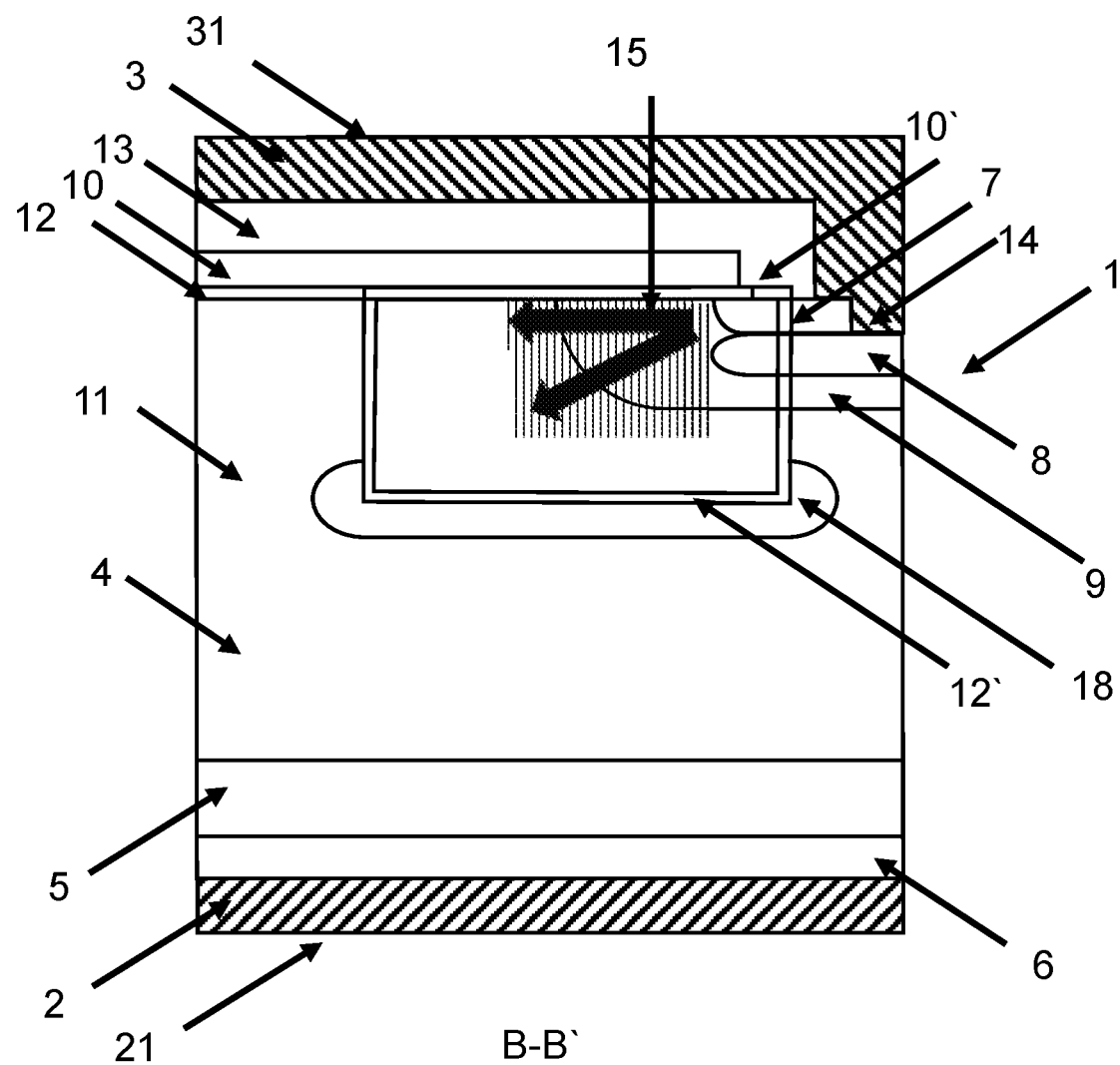
Figure (13C)

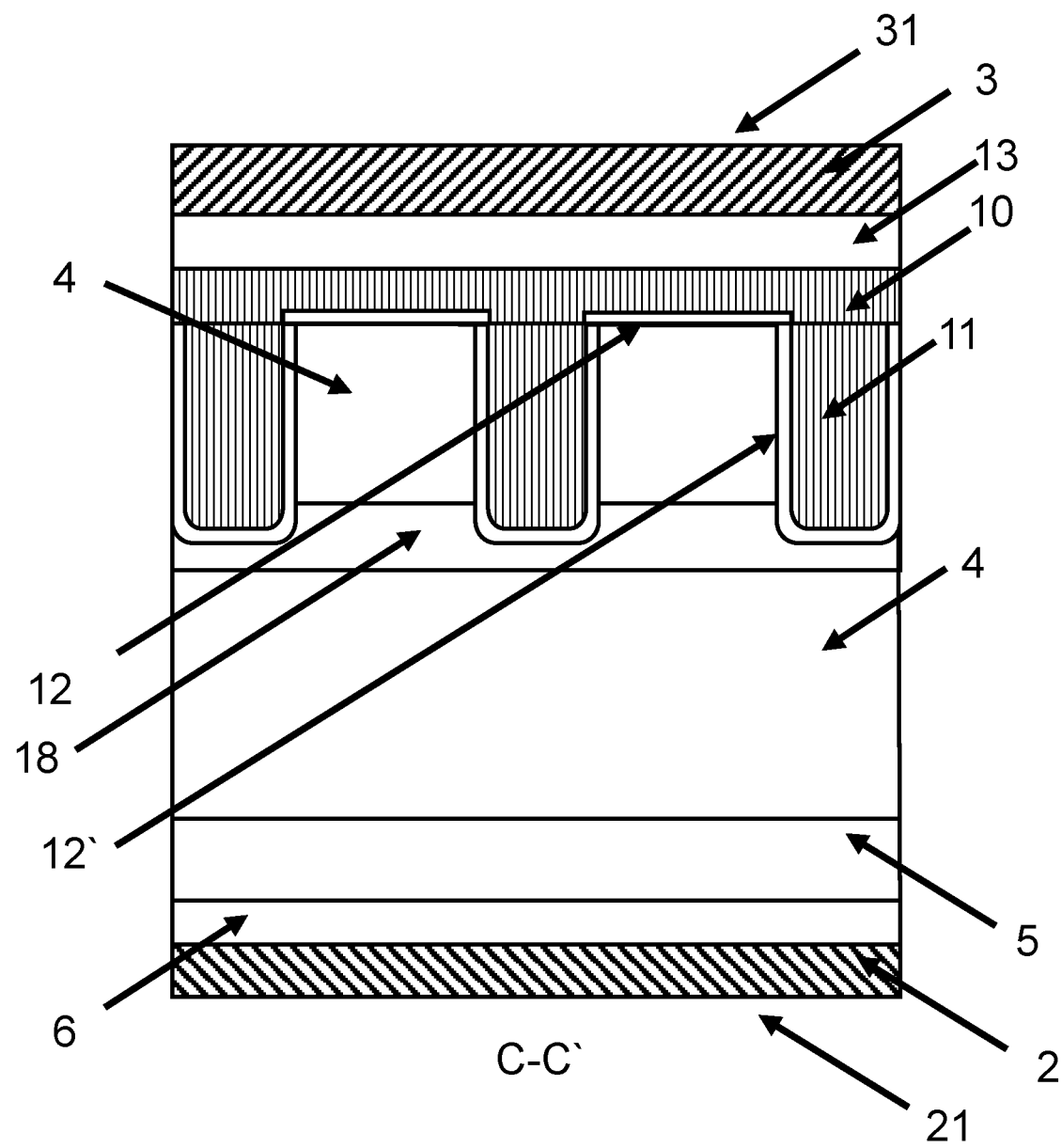
Figure (13D)

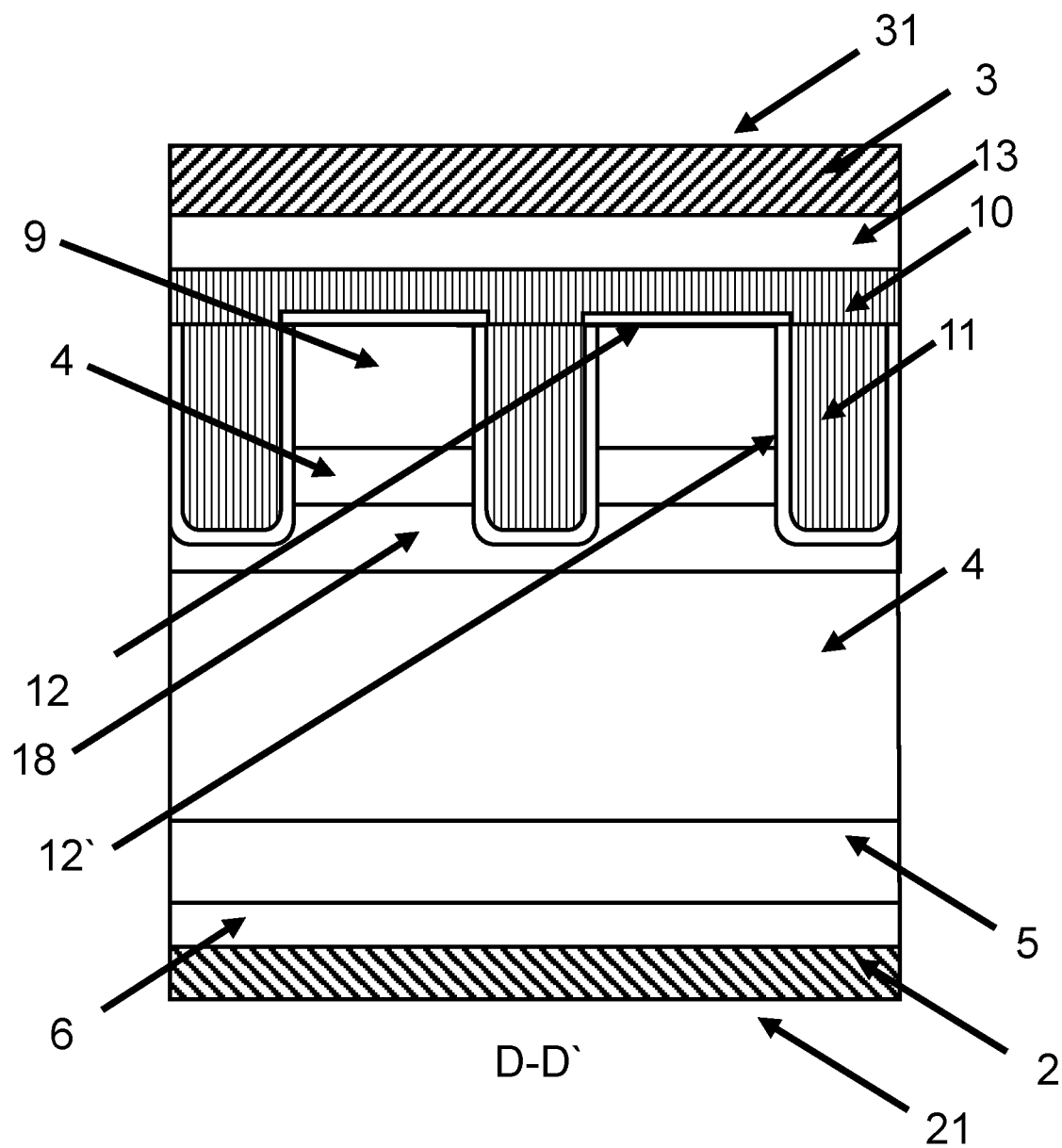
Figure (13E)

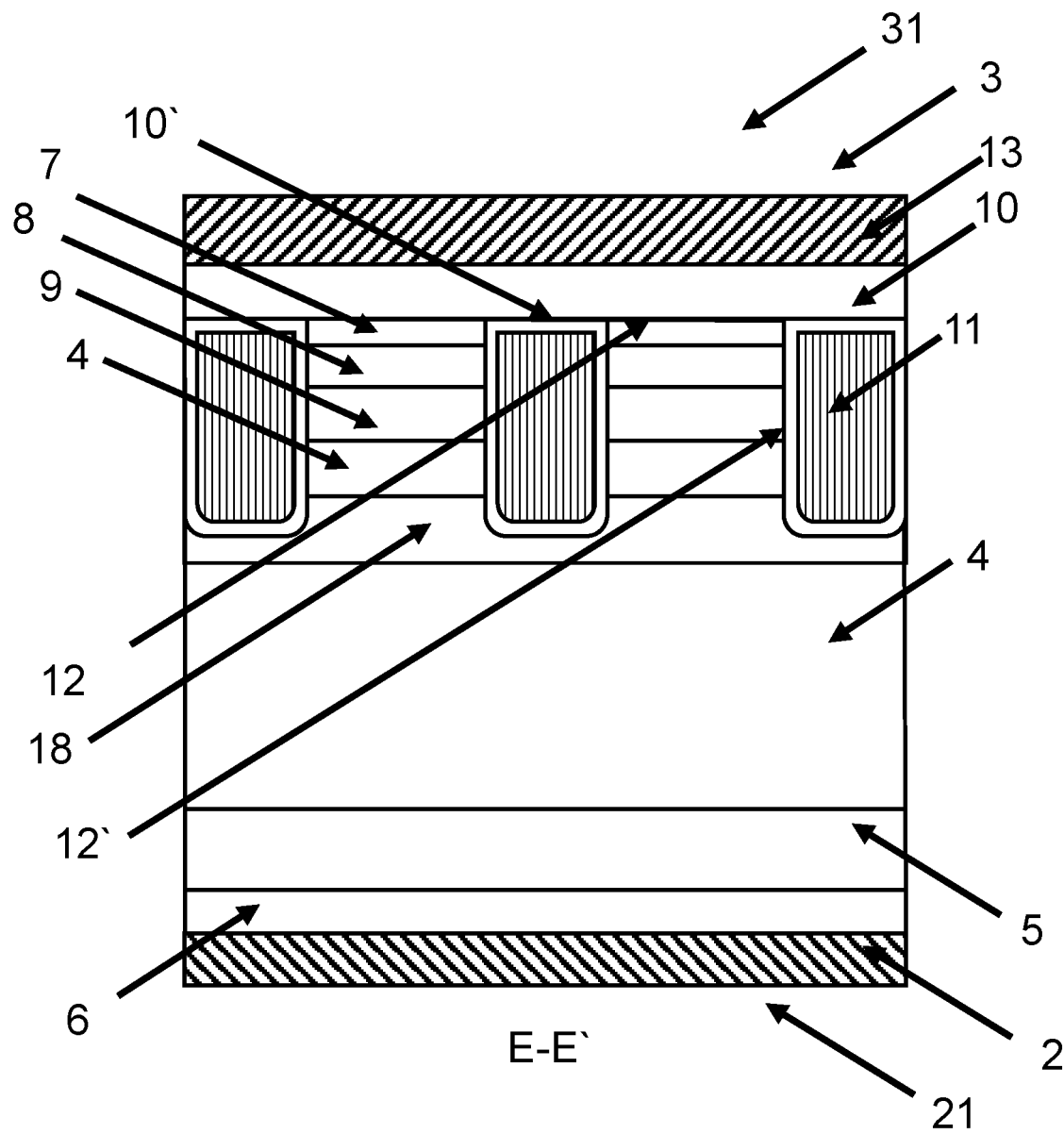
Figure (13F)

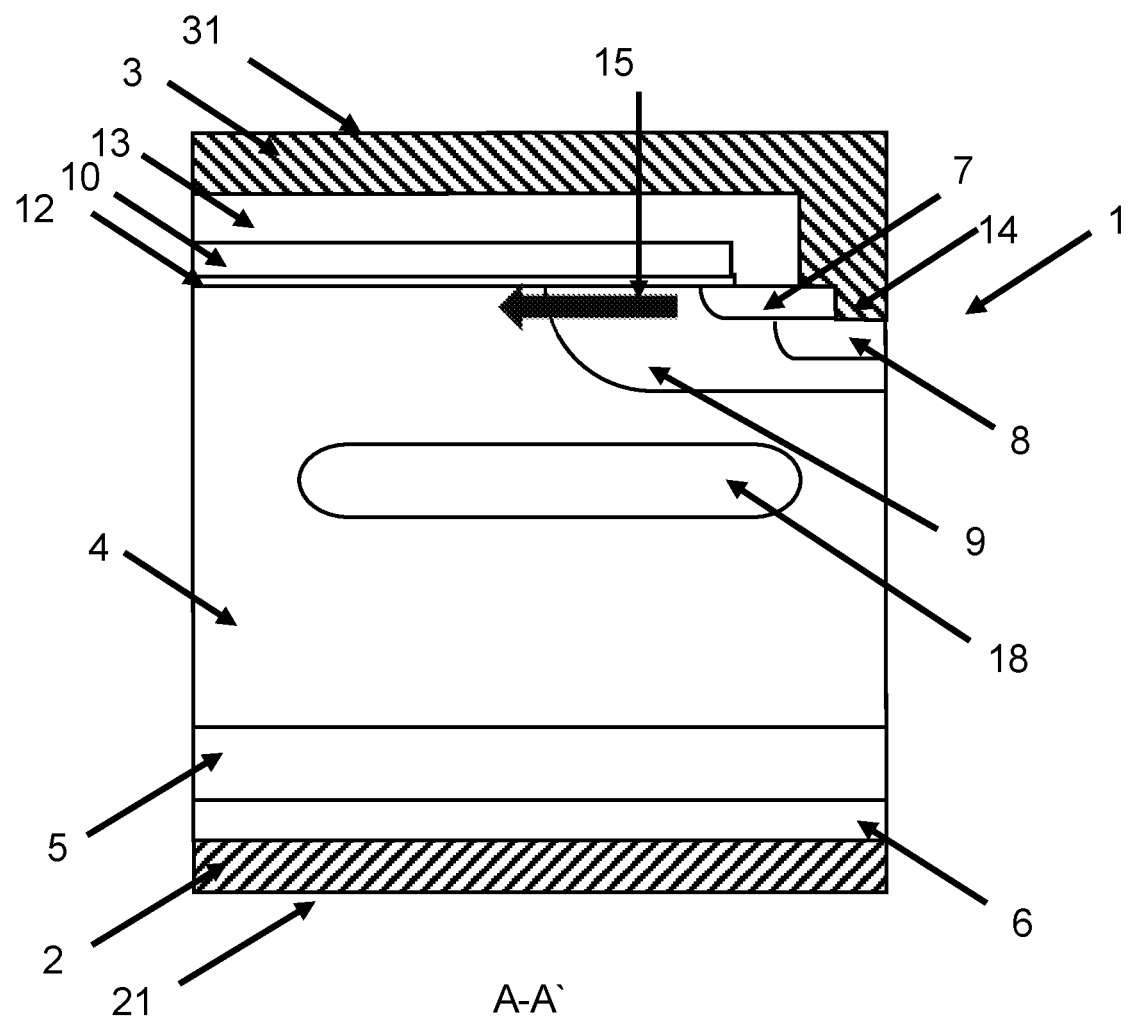
Figure (14A)

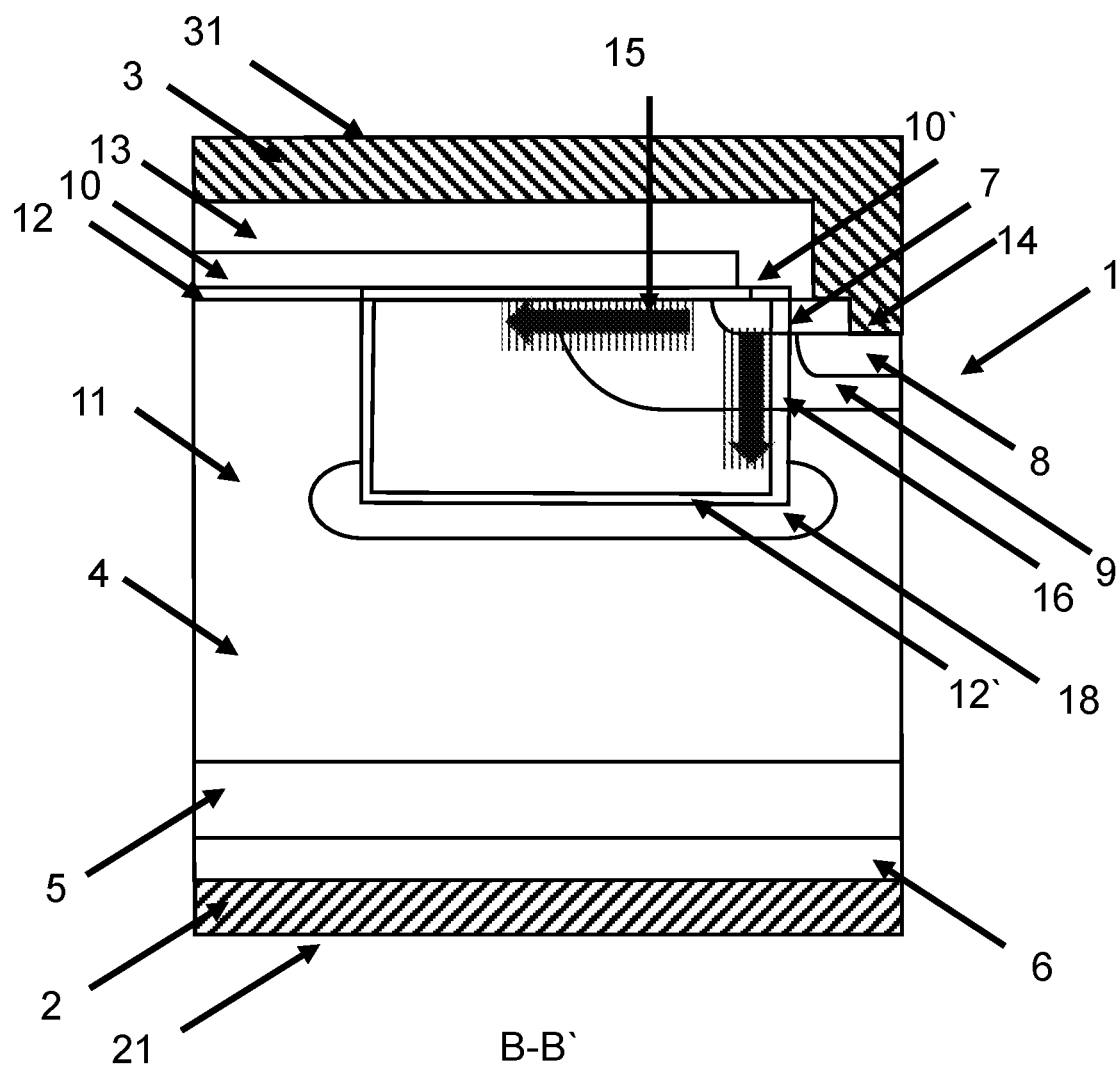
Figure (14B)

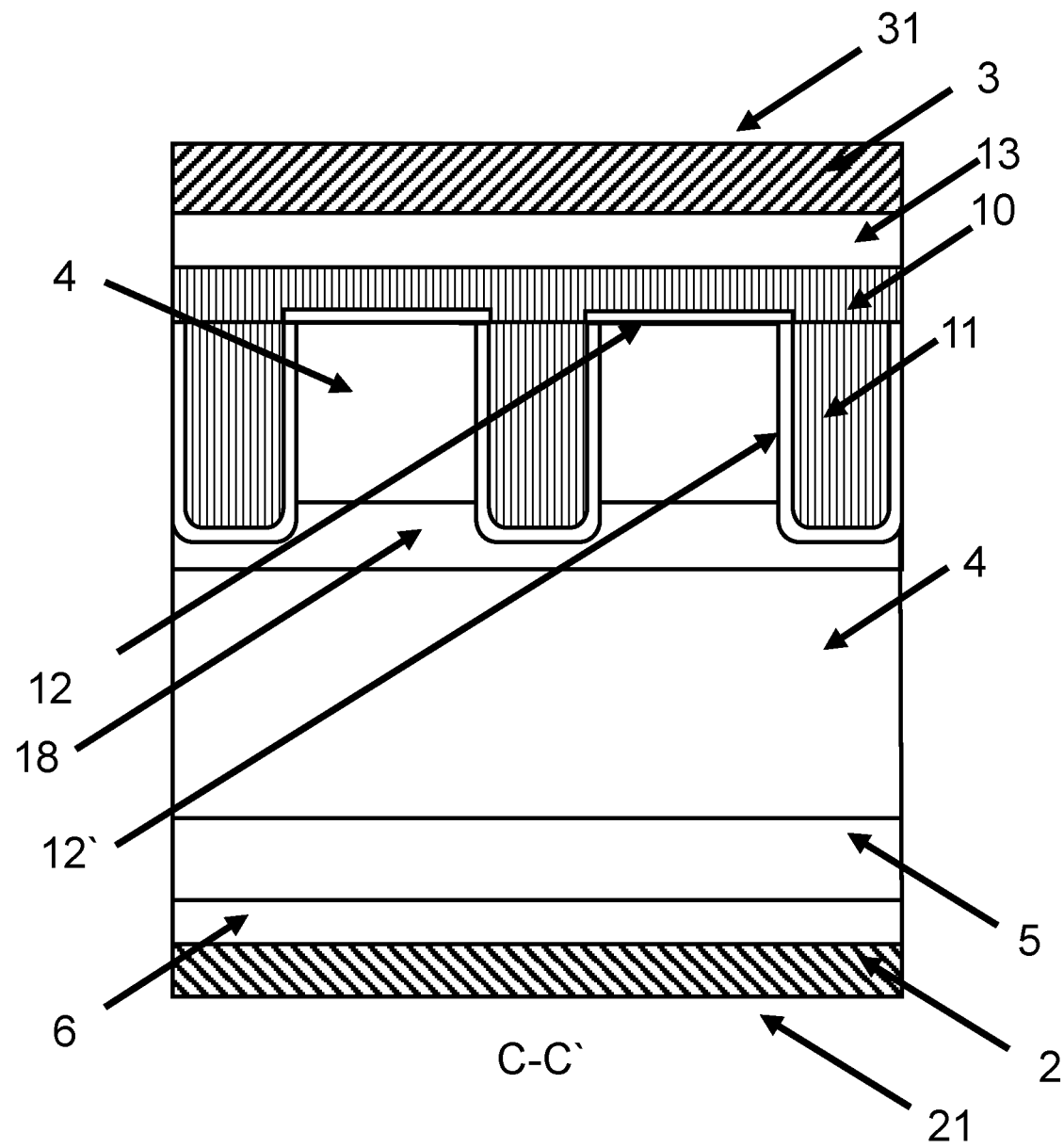
Figure (14C)

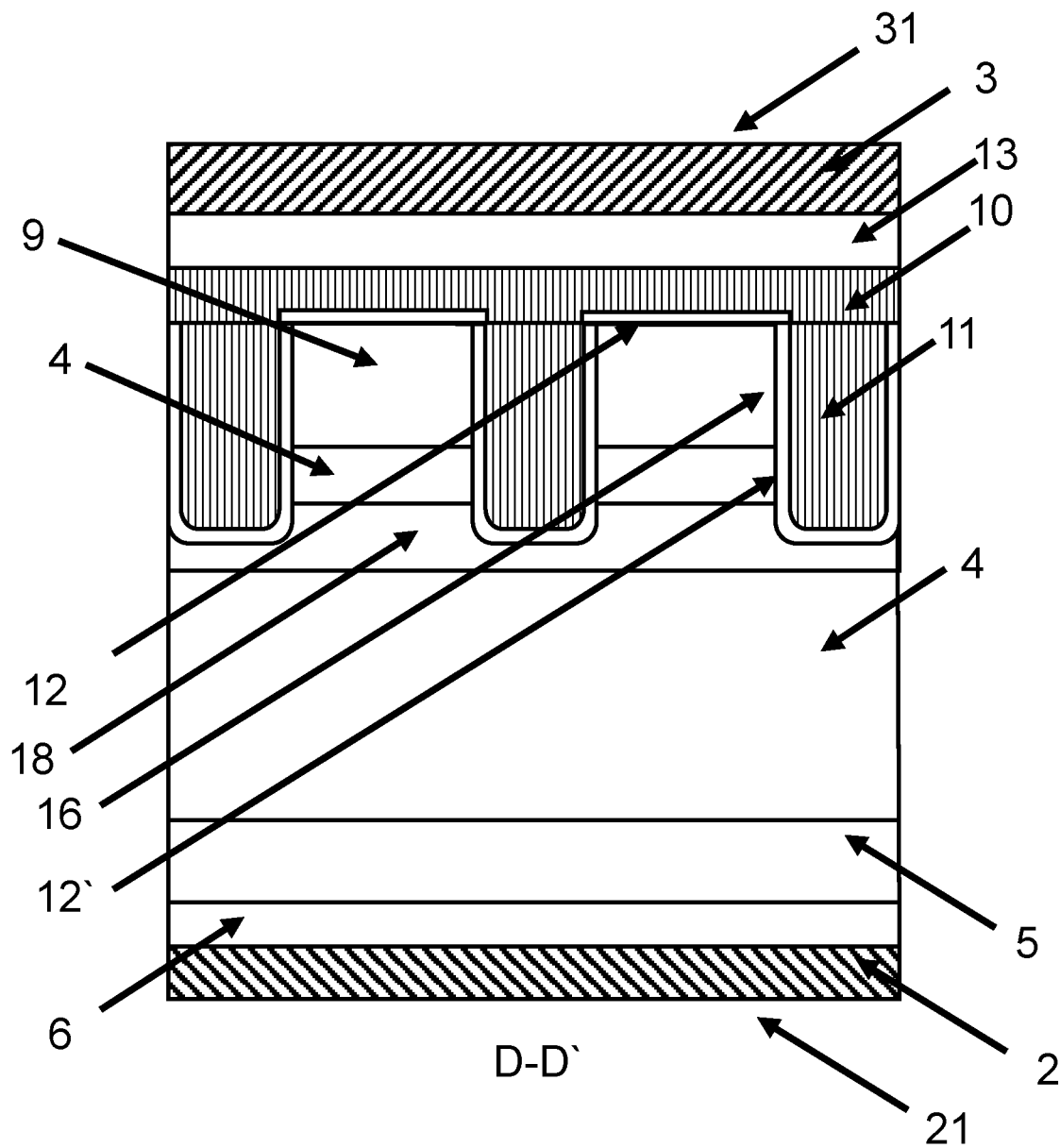
Figure (14D)

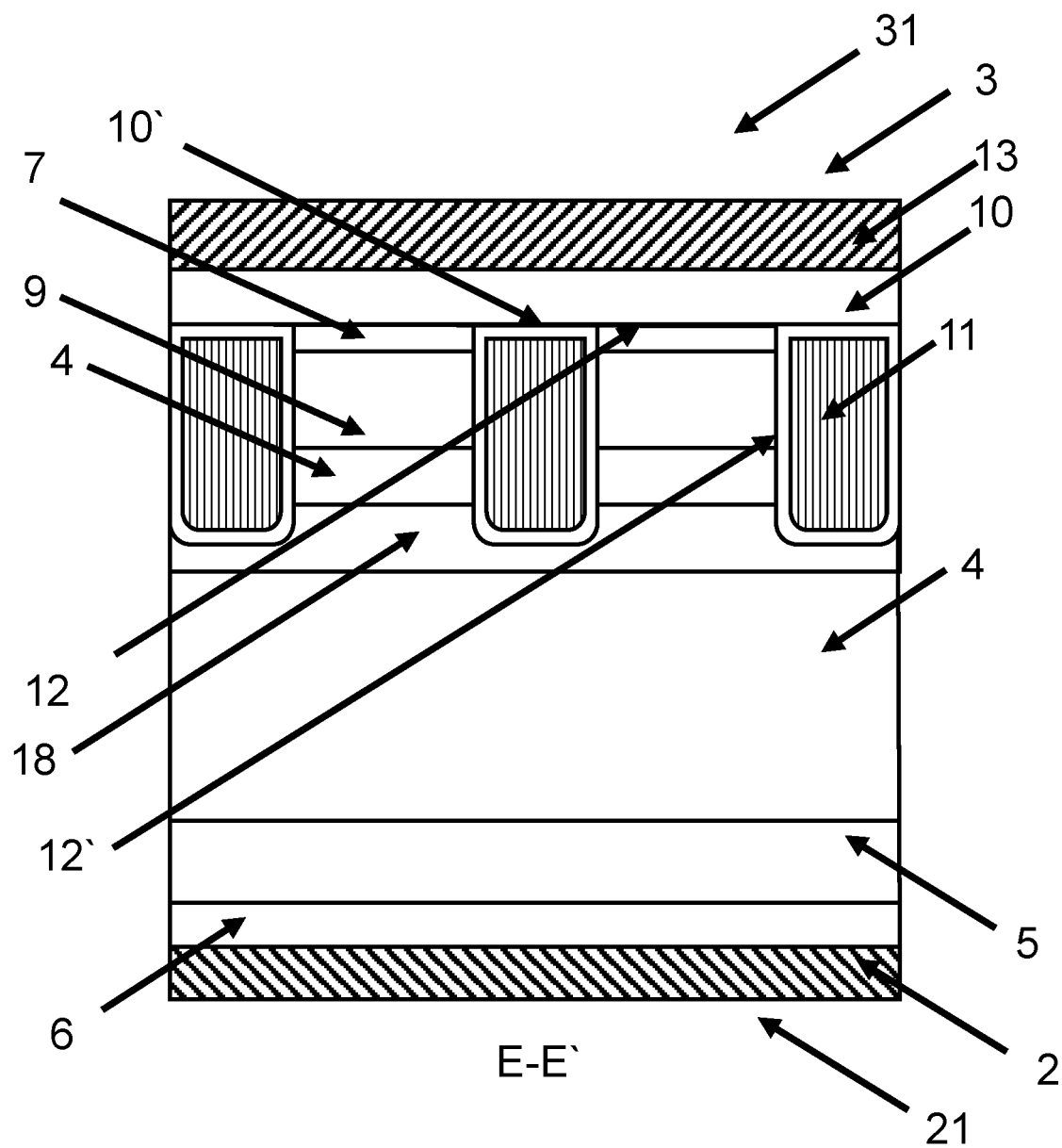
Figure (14E)

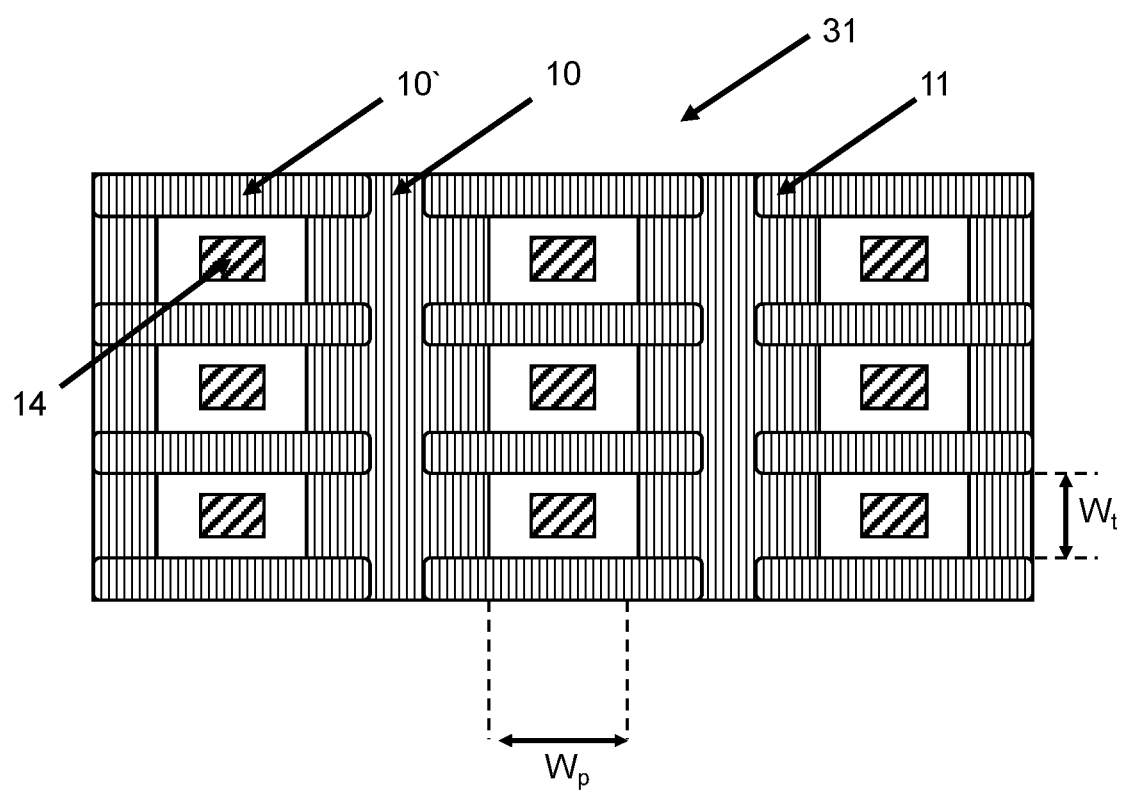
Figure (15A)

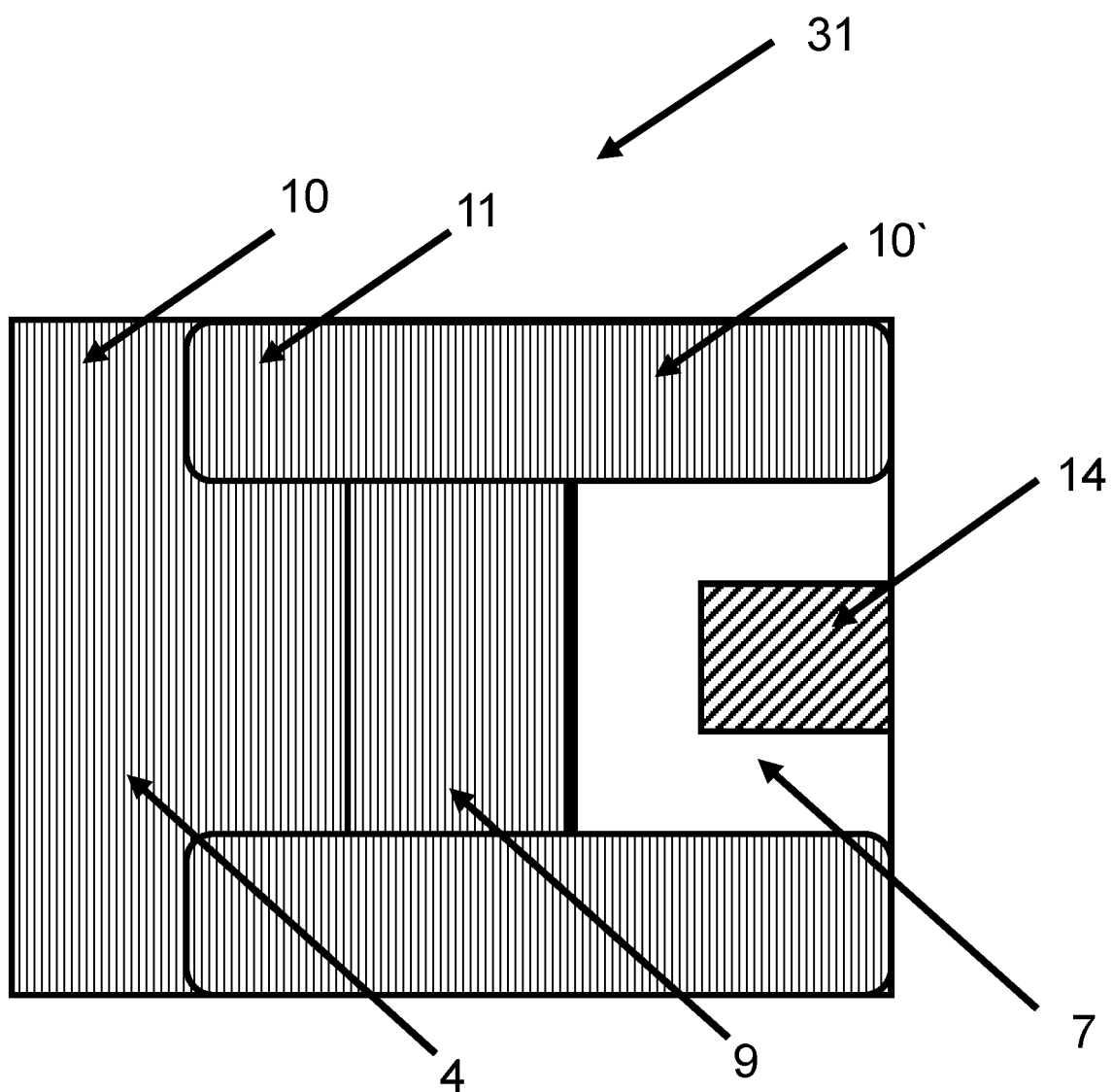
Figure (15B)

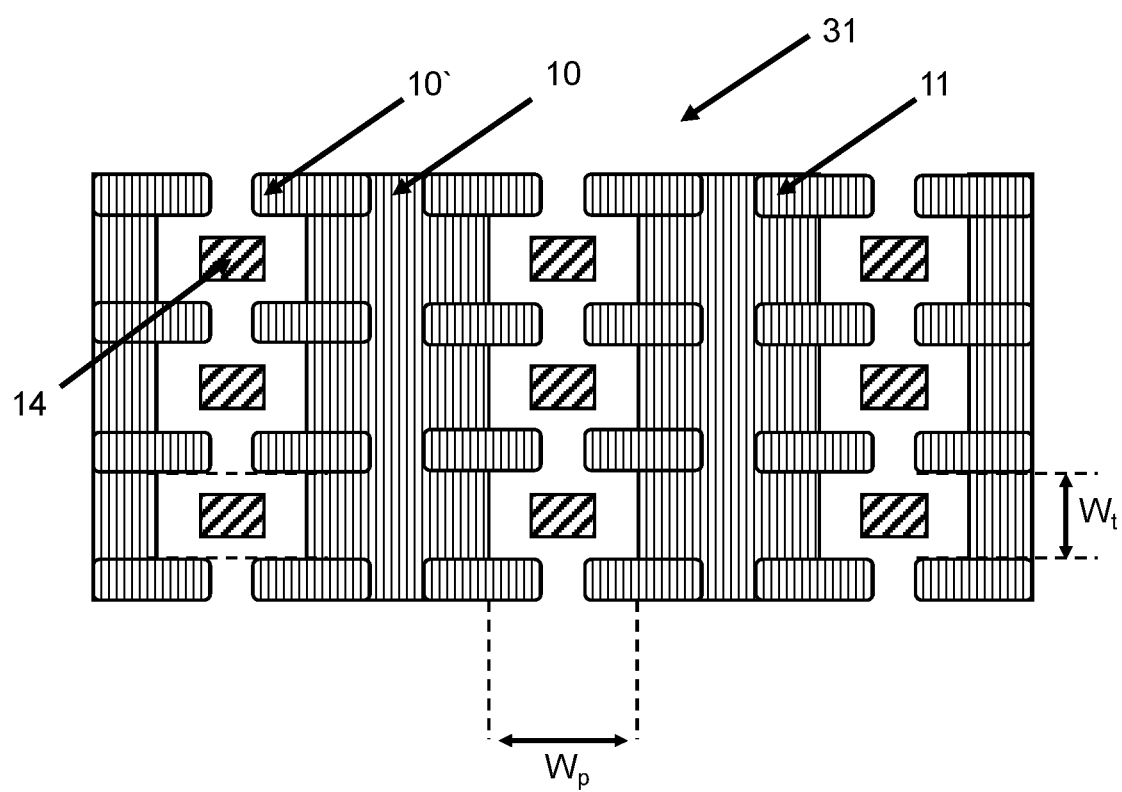
Figure (16A)

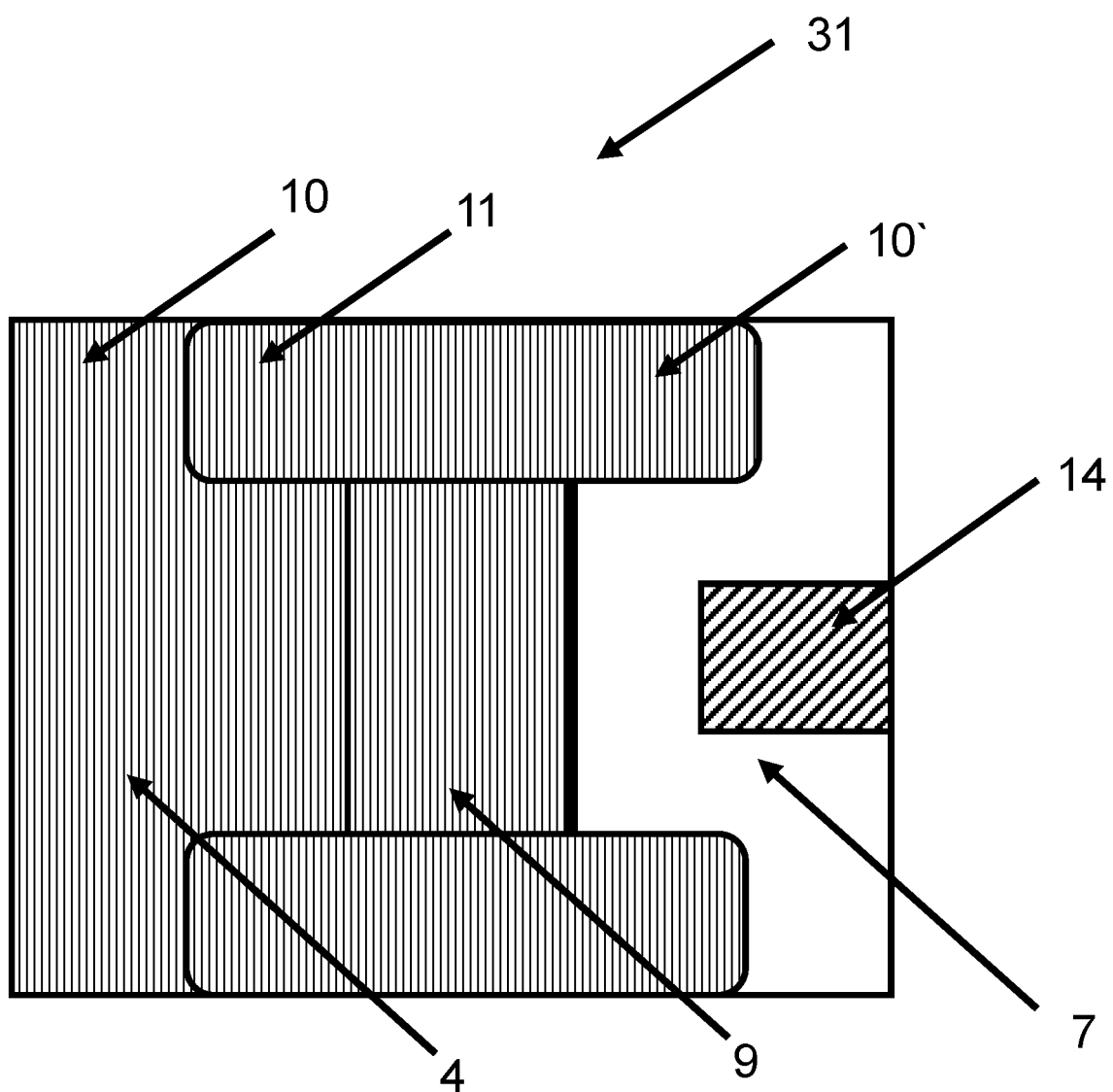
Figure (16B)

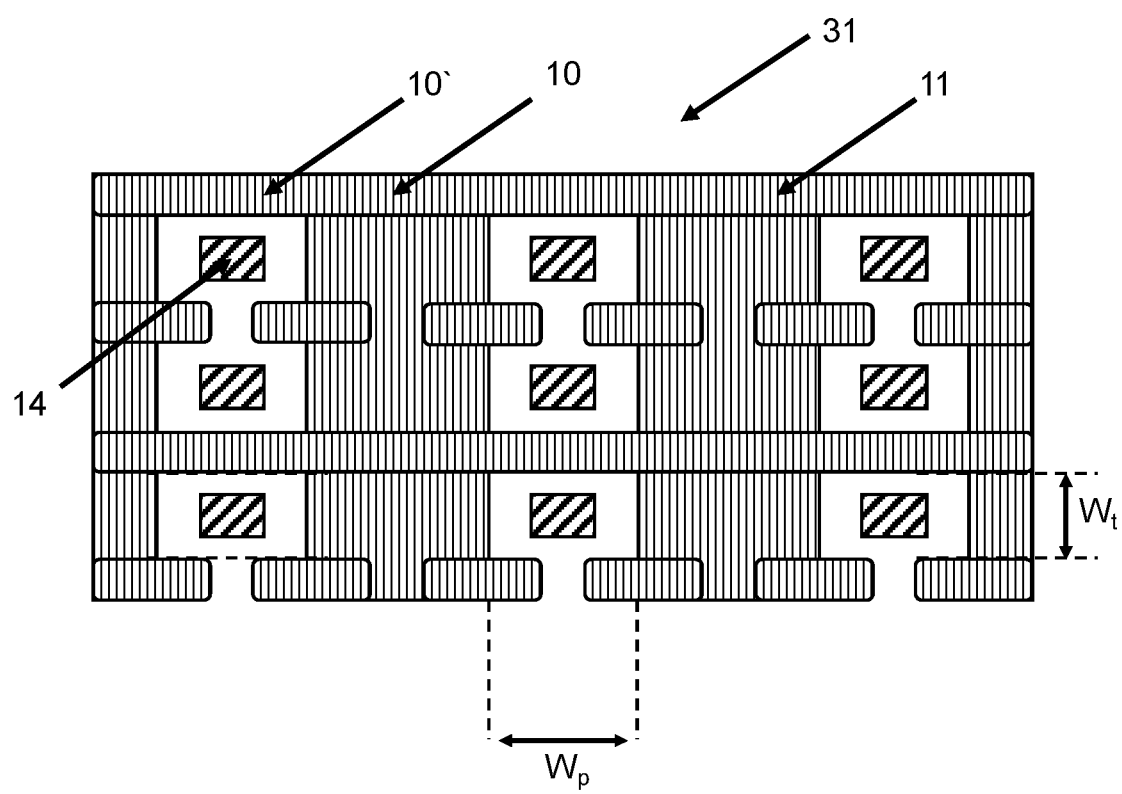
Figure (17)

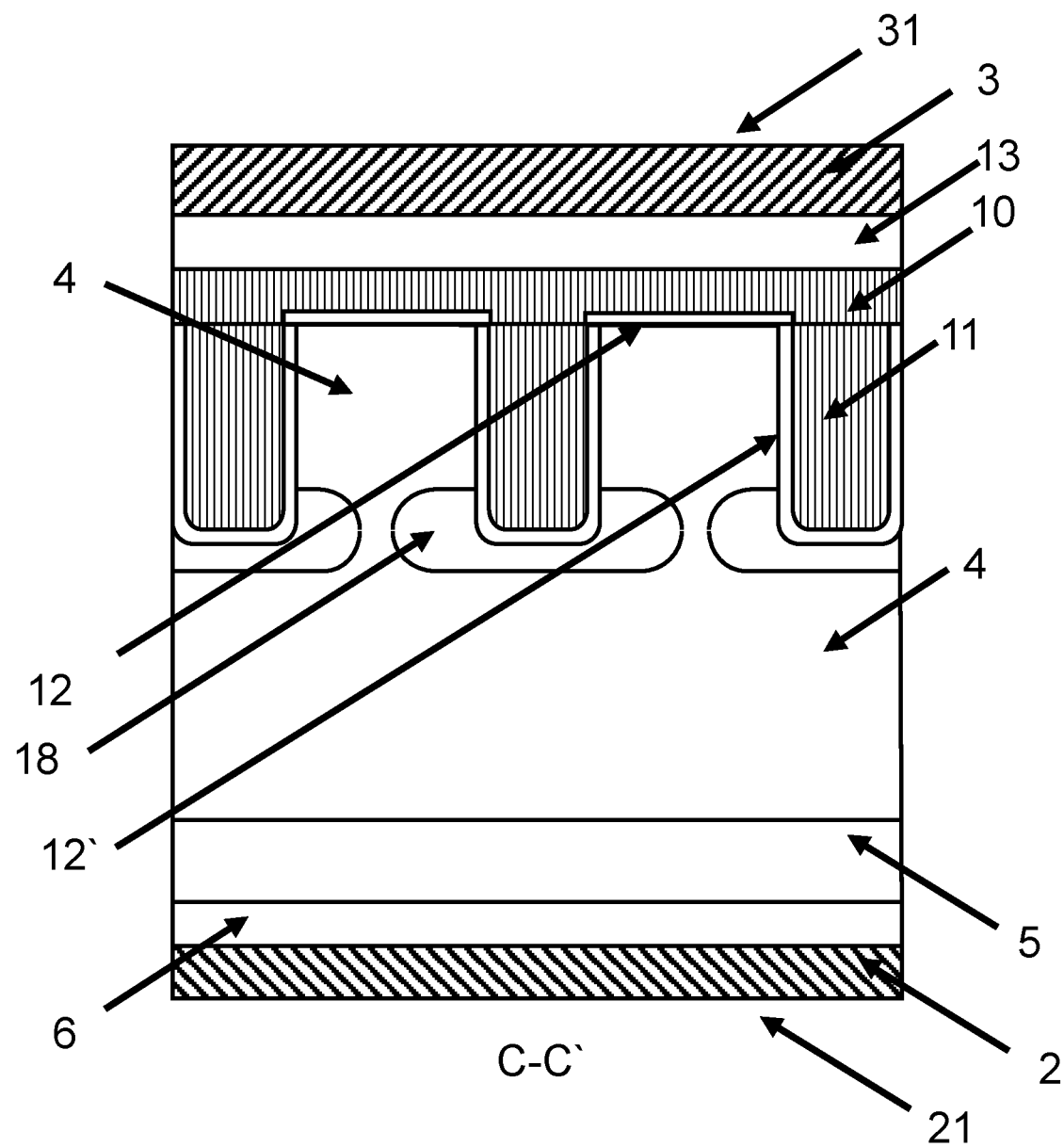
Figure (18)

FORTIFIED TRENCH PLANAR MOS POWER TRANSISTOR

CROSS-REFERENCE TO RELATED APPLICATIONS

The present application claims priority to GB Patent Application No. 1919430.7 filed on 30 Dec. 2019. The entirety of this application is hereby incorporated by reference for all purposes.

FIELD OF THE INVENTION

The invention relates to the field of power semiconductor devices. Power semiconductor devices that are able to withstand a blocking voltage of several hundred Volts at high current rating are typically implemented as vertical or lateral structures, wherein the semiconductor wafer is based for example on a semiconducting material such as silicon (Si) or silicon carbide (SiC) or diamond or gallium oxide (Ga2O3) or gallium nitride (GaN) or zinc oxide (ZnO). More particularly, this invention relates to a power semiconductor device using planar gates and trench like structures with doped areas for the protection against high electrical fields at the bottom regions of the trenches.

BACKGROUND

Planar and Trench MOS cell designs exhibit a number of advantages and disadvantages for IGBT and MOSFET designs. For IGBTs, typical Planar and Trench designs are shown in FIGS. 1A and 2A. Both designs can incorporate an enhancement n-type layer for improved excess carrier storage as shown in FIGS. 1B and 2B.

FIG. 1A shows a prior art IGBT with planar gate electrodes in accordance to U.S. Pat. No. 5,795,793, for example. The IGBT 100 is a device with a four-layer structure, which are arranged between an emitter electrode (3) on an emitter side (31) and a collector electrode (2) on a collector side (21), which is arranged opposite of the emitter side (31). An (N-) doped drift layer (4) is arranged between the emitter side (31) and the collector side (21). A P-doped planar base layer (9) is arranged between the drift layer (4) and the emitter electrode (3), which planar base layer (9) is in direct electrical contact to the emitter electrode (3). A planar N-doped source region (7) is arranged on the emitter side (31) embedded into the planar base layer (9) and contact opening (14) to the emitter electrode (3). In addition, a planar P-doped layer (8) is arranged on the emitter side (31) below region (7) and embedded into the planar base layer (9) and contact opening (14) through region (7) and extending to region (8) is formed for the emitter electrode (3).

A planar gate electrode (10) is arranged on top of the emitter side (31). The planar gate electrode (10) is electrically insulated from the planar base layer (9), the planar source region (7) and the drift layer (4) by a planar insulating layer (12). There is a further insulating layer (13) arranged between the planar gate electrode (10) and the emitter electrode (3).

The planar cell concept offers a lateral MOS channel (15) which suffers from non-optimal charge spreading (so called JFET effect) near the cell resulting in low carrier enhancement and higher conduction losses. Furthermore, due to the lateral channel design, the planar cell design suffers also from the PNP bipolar transistor hole drain effect (PNP effect) due to the bad electron spreading out of the MOS channel.

However, the accumulation layer between the MOS cells offers strong charge enhancement for the PIN diode part (PIN effect). The planar design also requires more area resulting in less cell packing density for reduced channel resistance.

On the other hand, the planar design provides good blocking capability due to low peak fields at the cell and in between. The planar design can also provide good controllability and low switching losses and the cell densities in planar designs are easily adjusted for the required short circuit currents. Due to the fact that there exist few high peak electric fields in the gate oxide regions, the planar design offers good reliability with respect to parameter shifting during operation under high voltages. Also, the introduction of n-type enhanced layers (17) in planar cells has resulted in lower losses rivalling those achieved with trench designs as explained below.

The trench cell concept for a trench IGBT 200 shown in FIG. 2A offers a vertical MOS channel (16) which provides enhanced injection of electrons in the vertical direction and suffer from no drawbacks from charge spreading (JFET effect) near the cell. Therefore, the trench cells show much improved carrier enhancement for lower conduction losses. Due to the vertical channel design, the trench offers also less hole drain effect (PNP effect) due to the improved electron spreading out of the MOS channel. Modern trench designs adopting mesa widths (trench to trench distance) below 1 μm achieve very low conduction losses since closely packed trenches can provide a strong barrier to hole drainage. Matching such a performance with less complex processes can be of a great advantage. The accumulation layer at the bottom of the trench gate (11) offers strong charge enhancement for the PIN diode part. Hence wide and/or deep trenches show optimum performance. Furthermore, the trench design offers large cell packing density for reduced channel resistance.

However, the trench cell design suffers from lower blocking capability near the bottom corners of the trenches due to high peak electric fields. This has also resulted in parameter shifting during operation due to hot carrier injection into the gate oxide. The trench design has also a large MOS accumulation region and associated capacitance resulting in bad controllability and high switching losses. The high cell densities in trench designs will also result in high short circuit currents. Finally, gate parameter shifts can occur under normal gate biasing stress conditions due to the trench etch process in relation to the silicon crystal orientation and the critical region at the n-source and p-base junction which is formed at the trench gate oxide (12') which defines the device MOS parameters.

Hence, optimising the trench cell design to overcome the above drawbacks has normally resulted in higher losses when compared to the initial loss estimations and potential of trench designs. Many trench designs have been proposed with particular focus on the regions between the active MOS cells for lowering the losses and improving the device controllability. Another approach in previous inventions combines planar and trench designs were proposed to obtain the advantage of the planar designs (region between the cells) and trench designs (the cell) while eliminating some of the drawbacks of the planar and trench designs.

In U.S. Pat. No. 9,064,925, for example, the Trench Planar IGBT 300 shown in FIG. 3 combines both a planar and trench MOS cells in a single design. However, both the planar channel (15) and trench channel (16) are separated. Similarly, in "Trench emitter IGBT with lateral and vertical MOS channels" (Proc. 23rd Internat. Conf. on Microelectronics MIEL 2002, 163-166) an IGBT is described, which comprises trench gate electrodes and planar gate electrodes in one device.

A Trench Planar MOSFET cell (Solid State Electronics, V 38, No 4, page 821-828, 1995) represents the first publication of Trench Planar MOS cell design. A similar design was published as a Trench Planar IGBT (IEEE Electron Device Letters, Vol 20, No. 11, November 1999, page 580). The Trench Planar IGBT 400 design shown in FIG. 4A consists only of a planar channel and proposes the use of a trench structure to improve the minority charge carrier accumulation. The concept proposed shallow trenches for improved blocking capability. In U.S. Pat. No. 8,441,046, a Planar Trench MOS IGBT 500 with an enhancement layer was described as shown in FIG. 4B. Similar to the Trench Planar MOS cell described above, the Planar Trench design includes a planar channel (15) and a trench channel (16) with the trench channel having higher doping levels compared to the Trench Planar design.

It is usual with such power transistor structures to spend significant effort in design and processing to ensure that the overall device performance is not impacted by the high electric fields at the bottom region of the trenches. Thus U.S. Pat. No. 10,090,297 for example, describes a power transistor configuration (202) as depicted in FIG. 5, including a P-doped floating layer (18) formed so as to partially wrap around the bottom of the trenches. It is therefore possible to alleviate collector-emitter voltage from burdening the trench during switching OFF phases. Thus, it is possible to suppress device failure due to sudden changes in voltage (dv/dt). This allows for the short-circuit resistance of the power transistor to be maintained. Furthermore, the short-circuit resistance can be improved by the floating layer (18) being deeper than the base layer (9), and the base layer (9) can be made shallow; therefore, it is possible to shorten the channel length by appropriately designing the depth of the base layer, thereby suppressing an increase in the on-state voltage drop.

The majority of the above patents describe an active trench connected to the gate in combination with a planar channel in a two-dimensional arrangement.

In a closely related prior art to the present invention, U.S. Pat. Nos. 6,380,586 and 8,441,046 describe a trench IGBT 600 where planar channels (15) are orthogonally positioned in relation to the trench regions as shown in FIG. 6A for an embodiment having a discontinued trench at the emitter contact (3). A continuous trench cutting through the emitter contact (3) was also described. The main feature of this structure is the trench channel (16) which will provide electron injection in both lateral and vertical dimensions at the trench wall as shown in the cross-section A-A' as shown in FIG. 6B. Such a power transistor will have different MOS parameters such as the threshold voltage for the vertical and lateral channels. Furthermore, for the discontinued version, the trench MOS channel (16) at the trench periphery near (10') can become critical due to the sharp trench curvature in that region.

The structures described above also suffer from complex and critical alignment process steps such as N-source (7) and P-region (8) structuring which can also increase the cost and limit the option to reduce the cell dimensions for providing lower losses.

It is desirable to find a new MOS cell design concept that can still benefit from the combination of the trench and planar MOS cell concepts while enabling simple process steps and lower conduction/on-state losses.

SUMMARY

It may be an object of the present invention to provide a power semiconductor device with reduced on-state losses, low drainage of holes, stable gate parameters, improved blocking capability, and good controllability, such as an Insulated Gate Bipolar Transistor (IGBT) with improved electrical characteristics.

These objects may be met by the subject matter of the independent claims. Embodiments of the invention are described with respect to the dependent claims.

The problem is solved by the semiconductor device with the characteristics of claim 1.

The inventive power semiconductor device has layers of different conductivity types, which layers are arranged between an emitter electrode on an emitter side and a collector electrode on a collector side, which can be arranged opposite of the emitter side in the case of a vertical power semiconductor, but can also be arranged on the same emitter side in the case of lateral power semiconductors. The layers comprise, at a minimum:

a drift layer of a first conductivity type, which is arranged between the emitter side and the collector side, and a first base layer of a second conductivity type, which is arranged between the drift layer and the emitter electrode, which first base layer is in direct electrical contact to the emitter electrode, and a source region of the first conductivity type, which is arranged at the emitter side embedded into the first base layer and contacts the emitter electrode, which source region has a higher doping concentration than the drift layer, and extends to the first and second gate electrode, and a second base layer of the second conductivity type, which is arranged at the emitter side embedded into the first base layer and is situated vertically deeper than the source region and contacts the emitter electrode, which second base layer region has a higher doping concentration than the first base layer, and a first gate electrode, which is arranged on top of the emitter side, which first gate electrode is electrically insulated from the first base layer, the source region and the drift layer by a first insulating layer, an horizontal channel is formable between the emitter electrode, the first source region, the first base layer and the drift layer, and a plurality of second gate electrodes embedded in trench recesses, each of which is electrically insulated from the first base layer, second base layer, source region and the drift layer by a second insulating layer and which second gate electrode is arranged orthogonally to the longitudinal direction of the first base layer, second base layer and source region and extends deeper into the drift layer than the first base layer; characterized in that, no portion of the trench recesses is etched into the source region, therefore a vertical channel is not formable between the emitter electrode, the source region, the first base layer and the drift layer, and a floating layer of second conductivity type arranged at the bottom of the plurality of second gate electrodes, situated vertically deeper than the first base layer, insulated from the second gate electrodes by a second insulating layer, which floating layer can completely or only partially surround the bottom region of the any of the second gate electrodes, and optionally, an advanced enhancement layer of the first conductivity type, which is arranged between the drift layer and the first base layer, and completely surrounds the first base layer, which advanced enhancement layer region has a higher doping concentration than the drift layer, but a smaller doping concentration than the source region.

Another embodiment includes an adjustment of the layers mentioned above, with the following significant differences:
the second base layer of the second conductivity type is characterized in that, the lateral edge of the second base layer extends to the edge of the source region or can be longer or shorter than the edge of the source region (as referenced from the edge of the contact opening); and
the plurality of second gate electrodes embedded in trench recesses, are characterized in that, a portion of some of the trench recesses is etched into the source region, therefore a vertical channel can be formable between the emitter electrode, the source region, the first base layer and the drift layer, depending on the lateral extension of the second base layer as explained above. In particular, a vertical channel can be formed in this embodiment if the lateral edge of the second base layer extends less than the edge of the source region as referenced from the position of the contact opening.

Additional embodiments include the use of a segmented floating layer, instead of a contiguous layer, as well as the use of a mix of segmented and contiguous second gate electrodes, as will be explained in more details later on.

The inventive planar semiconductor device integrates a Trench into a Planar MOS cell in order to gain the advantages of both designs in terms of reduced on-state losses, low drainage of holes, stable gate parameters, improved blocking and good controllability.

The new design offers a wide range of advantages both in terms of performance (reduced losses, improved controllability and reliability), and ease of processing with the potential of applying enhanced layer structures. The inventive design is suitable for full or part stripes but can also be implemented in cellular designs.

The inventive design is also suitable for reverse conducting structures, and can be applied to both IGBTs and MOSFETs based on silicon or wide bandgap materials such as silicon carbide (SiC). In particular, the use of a highly doped region of first conductivity type, manufactured, as per the embodiments of this invention, adjacent to the MOS channel, can be very beneficial in reducing the voltage drop in conduction mode for SiC MOSFET semiconductors.

Those skilled in the art will recognize additional features and advantages upon reading the following detailed description and upon viewing the accompanying drawings.

BRIEF DESCRIPTION OF THE DRAWINGS

The embodiments of the invention will be explained in more detail in the following text with reference to the attached drawings, in which:

FIG. 1A: shows the cross section of a Planar MOS IGBT structure (prior art).

FIG. 1B: shows the cross section of an Enhanced Planar MOS IGBT structure (prior art).

FIG. 2A: shows the cross section of a Trench MOS IGBT structure (prior art).

FIG. 2B: shows the cross section of an Enhanced Trench MOS IGBT structure (prior art).

FIG. 3: shows a cross section of Trench Planar MOS IGBT structures (prior art).

FIG. 4A: shows a cross section of Planar Trench MOS IGBT structure with no channel on the trench (prior art).

FIG. 4B: shows a cross section of Trench Planar MOS IGBT structure with planar and trench MOS channels and enhancement layer (prior art).

FIG. 5: shows a cross section of Trench MOS IGBT structure with floating layer (prior art).

FIG. 6A: shows a 3D view of Trench Planar MOS IGBT structure with orthogonal trench gate electrodes to the planar channels (prior art).

FIG. 6B: shows a cross section of Trench Planar MOS IGBT structure with orthogonal trench gate electrodes along the cut line A-A' in FIG. 7A indicating the current flow in conduction mode (prior art).

FIG. 7: shows the 3D view of a first embodiment of a Trench Planar MOS IGBT structure according to the invention.

FIG. 8: shows the 3D view of a second embodiment of a Trench Planar MOS IGBT structure according to the invention.

FIG. 9: shows a 3D view of a third embodiment of a Trench Planar MOS IGBT structure according to the invention.

FIG. 10: Top view of a first exemplary embodiment of a Trench Planar MOS IGBT according to the invention.

FIG. 11A: Top view of a detailed area of a first exemplary embodiment of a Trench Planar MOS IGBT according to the invention.

FIG. 11B: Cross section along line A-A' of first exemplary embodiment of a Trench Planar MOS IGBT according to the invention.

FIG. 11C: Cross section along line B-B' of first exemplary embodiment of a Trench Planar MOS IGBT according to the invention, indicating the current flow in conduction mode.

FIG. 11D: Cross section along line C-C' of first exemplary embodiment of a Trench Planar MOS IGBT according to the invention FIG. 11E: Cross section along line D-D' of first exemplary embodiment of a Trench Planar MOS IGBT according to the invention.

FIG. 12: Top view of a second exemplary embodiment of a Trench Planar MOS IGBT according to the invention.

FIG. 13A: Top view of a detailed area of a second exemplary embodiment of a Trench Planar MOS IGBT according to the invention, where the second p-base layer is extending laterally to the edge of the source region.

FIG. 13B: Cross section along line A-A' of a second exemplary embodiment of a Trench Planar MOS IGBT according to the invention.

FIG. 13C: Cross section along line B-B' of a second exemplary embodiment of a Trench Planar MOS IGBT according to the invention, indicating the current flow in conduction mode.

FIG. 13D: Cross section along line C-C' of a second exemplary embodiment of a Trench Planar MOS IGBT according to the invention.

FIG. 13E: Cross section along line D-D' of a second exemplary embodiment of a Trench Planar MOS IGBT according to the invention.

FIG. 13F: Cross section along line E-E' of a second exemplary embodiment of a Trench Planar MOS IGBT according to the invention.

FIG. 14A: Cross section along line A-A' of a third exemplary embodiment of a Trench Planar MOS IGBT according to the invention, where the second p-base layer is extending in the lateral direction less than the edge of the source region.

FIG. 14B: Cross section along line B-B' of a third exemplary embodiment of a Trench Planar MOS IGBT according to the invention, indicating the current flow in conduction mode.

FIG. 14C: Cross section along line C-C' of a third exemplary embodiment of a Trench Planar MOS IGBT according to the invention.

FIG. 14D: Cross section along line D-D' of a third exemplary embodiment of a Trench Planar MOS IGBT according to the invention.

FIG. 14E: Cross section along line E-E' of a third exemplary embodiment of a Trench Planar MOS IGBT according to the invention.

FIG. 15A: Top view of a fourth exemplary embodiment of a Trench Planar MOS IGBT according to the invention.

FIG. 15B: Detailed top view of a fourth exemplary embodiment of a Trench Planar MOS IGBT according to the invention.

FIG. 16A: Top view of a fifth exemplary embodiment of a Trench Planar MOS IGBT according to the invention.

FIG. 16B: Detailed top view of a fifth exemplary embodiment of a Trench Planar MOS IGBT according to the invention.

FIG. 17: Top view of a sixth exemplary embodiment of a Trench Planar MOS IGBT according to the invention.

FIG. 18: Cross section of a seventh embodiment of a Trench Planar MOS IGBT structure according to the invention, with segmented floating layer.

The reference symbols used in the figures and their meaning are summarized in the list of reference symbols. The drawings are only schematically and not to scale. Generally, alike or alike-functioning parts are given the same reference symbols. The described embodiments are meant as examples and shall not confine the invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure (s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

Unless otherwise defined, all terms (including technical and scientific terms) used herein have the same meaning as commonly understood by one of ordinary skill in the art to which example embodiments belong. It will be further understood that terms, e. g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

In this specification, N-doped is referred to as first conductivity type while P-doped is referred to as second conductivity type. Alternatively, the semiconductor devices can be formed with opposite doping relations so that the first conductivity type can be P-doped and the second conductivity type can be N-doped.

Specific embodiments described in this specification pertain to, without being limited thereto, insulated gate bipolar semiconductor devices.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e. g. "between" versus "directly between", "adjacent" versus "directly adjacent," etc.).

The inventive power transistor includes a planar cell forming a horizontal MOS channel and a plurality of trenches, which are arranged orthogonally to the longitudinal direction of the planar cells. The new invention introduces P-doped layers (18) at the bottom of the orthogonal trenches rounded regions to protect the semiconductor device against high peak electric fields which could result in device performance degradation. To obtain maximum protection and be able to protect all trench regions, the P-doped layers (18) are merged easily since the orthogonal trenches are positioned closely. As a consequence, the orthogonal trenches are discontinued to allow the planar channels to conduct electrons. The new cell concept can adopt both planar MOS channels and Trench MOS channels in a single MOS cell structure, or planar MOS channels alone, while utilising the trenches to improve the current spreading of the planar MOS channels.

FIG. 7 shows a first exemplary embodiment of a power semiconductor device 1 in form of a punch through insulated gate bipolar transistor (IGBT) with a four-layer structure (pnpn). The layers are arranged between an emitter electrode (3) on an emitter side (31), and a collector electrode (2) on a collector side (21), which is arranged opposite of the emitter side (31). The IGBT comprises the following layers:

an (N-) doped drift layer (4), which is arranged between the emitter side (31) and the collector side (21), a P-doped first base layer (9), which is arranged between the drift layer (4) and the emitter electrode (3), which first base layer (9) is in direct electrical contact to the emitter electrode (3), a P-doped second base layer (8), which is arranged between the first base layer (9) and the emitter electrode (3), which second base layer (8) is in direct electrical contact to the emitter electrode (3), which second base layer (8) has a higher doping concentration than the first base layer (9), which second base layer (8) extends vertically deeper than the source region (7), an N-doped source region (7), which is arranged at the emitter side (31) embedded into the first base layer (9) and contacts the emitter electrode (3), which source region (7) has a higher doping concentration than the drift layer (4), a first gate electrode (10), which is arranged on top of the emitter side (31) and the first gate electrode (10) is electrically insulated from the first base layer (9), the source region (7) and the drift layer (4) by a first insulating layer (12), an horizontal channel (15) is formable between the emitter electrode (31), the source region (7), the first base layer (9) and the drift layer (4), a plurality of second gate electrodes (11), each of which is electrically insulated from the first base layer (9), the second base layer (8), and the drift layer (4) by a second insulating layer (12') and which second gate electrodes (11) are arranged in trench recesses oriented orthogonally to the longitudinal direction of the first base layer (9), the second base layer (8), and source region (7) and extends deeper into the drift layer (4) than the first base layer (9), a collector layer (6) arranged between the buffer layer (5) and the collector electrode (2), which the collector layer (6) is in direct electrical contact to the collector electrode (2), a buffer layer (5) arranged between the collector layer (6) and the drift region (4), a P-doped floating layer (18) arranged in the drift region (4) in a manner that the bottom regions of the gate electrodes and trenches (11) are embedded in the layer (18).

In the first embodiment, the orthogonal trench recesses embedding the second gate electrodes are etched away from the source regions (7). Therefore, a vertical channel is not formable between the emitter electrode (3), the source region (7), the second base layer (8), the first base layer (9) and the drift layer (4).

FIG. 8 shows a second embodiment of a power semiconductor device in form of a punch through insulated gate bipolar transistor (IGBT) with a four-layer structure (pnpn). The layers are arranged between an emitter electrode (3) on an emitter side (31), and a collector electrode (2) on a collector side (21), which is arranged opposite of the emitter side (31). The IGBT comprises the following layers:

an (N-) doped drift layer (4), which is arranged between the emitter side (31) and the collector side (21), a P-doped first base layer (9), which is arranged between the drift layer (4) and the emitter electrode (3), which first base layer (9) is in direct electrical contact to the emitter electrode (3), a P-doped second base layer (8), which is arranged between the first base layer (9) and the emitter electrode (3), which second base layer (8) is in direct electrical contact to the emitter electrode (3), which second base layer (8) has a higher doping concentration than the first base layer (9), which second base layer (8) extends vertically deeper than the source region (7), and which second base layer (8) extends laterally at least to the edge of the source region (7) or more, an N-doped source region (7), which is arranged at the emitter side (31) embedded into the first base layer (9) and contacts the emitter electrode (3), which source region (7) has a higher doping concentration than the drift layer (4), a first gate electrode (10), which is arranged on top of the emitter side (31) and the first gate electrode (10) is electrically insulated from the first base layer (9), the source region (7) and the drift layer (4) by a first insulating layer (12), an horizontal channel (15) is formable between the emitter electrode (31), the source region (7), the first base layer (9) and the drift layer (4), a plurality of second gate electrodes (11), each of which is electrically insulated from the first base layer (9), the second base layer (8), the source region (7) and the drift layer (4) by a second insulating layer (12') and which second gate electrodes (11) are arranged in trench recesses oriented orthogonally to the longitudinal direction of the first base layer (9), the second base layer (8), and source region (7) and extends deeper into the drift layer (4) than the first base layer (9), a collector layer (6) arranged between the buffer layer (5) and the collector electrode (2), which the collector layer (6) is in direct electrical contact to the collector electrode (2), a buffer layer (5) arranged between the collector layer (6) and the drift region (4), a P-doped floating layer (18) arranged in the drift region (4) in a manner that the bottom regions of the gate electrodes and trenches (11) are embedded in the layer (18).

In the second embodiment, some of the trench recesses embedding the second gate electrodes are etched also in the source regions (7), however a vertical channel is not formable between the emitter electrode (3), the source region (7), the second base layer (8), the first base layer (9) and the drift layer (4). This is due to the fact that the highly doped second base layer (8) extends to the edge of the source region or more, and an inversion layer cannot be easily formed at the surface of the trench gates.

A third embodiment is shown in FIG. 9, wherein the IGBT comprises the same layers as the second embodiment, with the major difference that the second base layer (8) extends laterally to a smaller extent than the edge of the source region (7) and therefore a vertical channel is formable between the emitter electrode, the source region, the first base layer and the drift layer.

The trench regions can be better viewed in the top cell views shown in FIG. 10 for the first embodiments of the inventive design, and in FIG. 12 for the second and third embodiments of the inventive design. The inventive design consists of a basic planar MOS cell design with active trenches 11 (connected to gate electrode 10) occupying the regions between the planar cells in the third dimension or in other words orthogonal to the planar channels. FIG. 11A shows a magnified detail of FIG. 10, and includes the main planes for cross-sections shown in FIGS. 11B to 11E. In particular, the FIG. 11C shows a cross section of an IGBT according to the first embodiment, indicating that no vertical channel is formable between the source region (7), the first base layer (9), and the drift layer (4). As such, only the planar MOS channel (15) is active in this structure, and the trench structures are used to improve enhance the minority charge spreading and concentration at the emitter side (31).

FIG. 13A shows a magnified detail of FIG. 12, and includes the main planes for cross-sections shown in FIGS. 13B to 13F. In particular, the FIG. 13C shows a cross section of an IGBT according to the second embodiment, indicating that no vertical channel is formable between the source region (7), the first base layer (9), and the drift layer (4) due to the second layer which extends to the edge of the source region (7). As such, the planar MOS channel (15) is mainly active in this structure, and the trench structures are used to generate improved carrier spreading and "point injection effect" for the minority charge carriers at the emitter side (31).

FIGS. 14A to 14E are cross sections of an IGBT according to a third embodiment. In particular, FIG. 14B indicates that in addition to the planar MOS channel (15), a vertical MOS channel (16) is formable between the source region (7), the first base layer (9), and the drift layer (4).

It is also possible to segment the source region (7) and the emitter contact opening (14) in the longitudinal direction (direction X in FIG. 7) in a cellular like design as shown in the two additional embodiments depicted in FIGS. 15A and 16A. This has the advantage of providing additional flexibility in defining the short-circuit capability of the power transistors. The magnified details from the top view are shown in the FIGS. 15B and 16B, respectively.

In a sixth embodiment represented in FIG. 17, a combination of contiguous and segmented second gate electrode trench recesses is considered to achieve a further improvement in the electrical characteristics of the power transistor. In particular, this structure increases the density of trenches on the emitter side (31), while still allowing the flow of electrons in the interrupted regions.

In order to ensure an unobstructed flow of electrons, the floating layer (18) can also be segmented in such a way that each trench recess with its corresponding gate electrode will have its bottom region surrounded by a floating layer segment, and each floating layer segment will be separated from the adjacent one by a certain distance. This seventh embodiment is indicated in the FIG. 18, which should be compared to the contiguous floating layers (18) depicted for example in FIG. 13D or 14C from the previous embodiments.

The trenches extend vertically to a depth approximately in a range from about 2 µm to about 7 µm. The width of the trenches may range from about 3 µm to about 0.5 µm.

With respect to the Cartesian coordinate system shown in FIG. 7, the critical design aspects are the dimension $W_t$ or mesa between the orthogonal trench recesses (in X direction), as well as the dimension $W_p$ representing the distance from the end of one trench recess to the adjacent trench recess in the direction of the planar channel. Improved carrier storage/reduced hole drainage is expected as the dimensions $W_t$ and $W_p$ are reduced. The value of $W_t$ may be in a range from about 5 µm to below 0.1 µm, more preferably from 1 µm to 0.1 µm—which is achievable with the proposed design because no additional structures have to be lithographically defined in between the trenches, as in the prior art. It is worth mentioning that for values of $W_t$ smaller than 0.2 µm it is possible that the vertical MOS channels along the walls of two adjacent trench recesses will partially or fully overlap leading to lowest conduction losses.

Also, improved carrier storage/reduced hole drainage is expected with reducing the planar cell dimensions, or by keeping the same pitch for the planar cell part, but reducing the distance $W_p$ by etching the adjacent trenches closer to each other in the Z direction. More specifically, $W_p$ could extend approximately in a range from about 20 µm to about 1 µm, preferably from 5 µm to 1 µm, and more preferably from 2 µm to 1 µm.

A layer of N-type conductivity with higher dopant concentration than the drift layer (4) can be also implanted and diffused during the manufacturing process. The N-type dopants can be implanted into the substrate (4) using the structured gate electrode layer with its opening as a mask. Afterwards, the implanted dopants are diffused or activated into the substrate (4) to create an enhancement layer or a current spreading layer arranged between the first base layer (9) and the drift layer (4).

The inventive design is also suitable for a reverse conducting semiconductor device by introducing N-type dopants at the collector side to form the shorts in the P-type collector layer (6), and producing an internal anti-parallel diode structure.

According to another embodiment, the planar gate electrode structures (10) can also have a pattern like arrangement on a top view of the surface of the emitter side (31) for example squares, hexagons, octagons or other regular polygons.

It is possible to apply the invention to a method for the manufacturing of semiconductor devices, in which the conductivity type of all layers is reversed, i.e. with a lightly P-doped substrate. or in which the substrate is formed of a wide bandgap semiconductor material such as SiC, GaN, Gallium Oxide, ZnO, Aluminum Oxide, Diamond, etc.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

REFERENCE LIST

1: inventive planar MOS cell power semiconductor device
2: collector metallization (electrode)
21: collector side
3: emitter metallization (electrode)
31: emitter side
4: drift layer, substrate
5: buffer layer
6: collector layer
7: source layer
8: second base layer
9: first base layer
10: planar gate electrode, electrically conductive layer
10': uncovered trench gate electrode
11: trench gate electrode, electrically conductive layer
12: insulating gate oxide gate electrode for planar gate
12': insulating gate oxide gate electrode for trench gate
13: insulation layer for planar cell and trench cell
14: emitter contact opening
15: horizontal channel for planar gate
16: vertical channel for trench gate
17: enhancement layer
18: floating layer
100: planar MOS cell power semiconductor device (prior art)
101: planar MOS cell power semiconductor device with enhancement layer (prior art)
200: trench MOS cell power semiconductor device (prior art)
201: trench MOS cell power semiconductor device with enhancement layer (prior art)
202: trench MOS cell power semiconductor device with p-floating region (prior art)
300: trench planar MOS cell power semiconductor device (prior art)
400: trench planar MOS cell power semiconductor device (prior art)
500: trench planar MOS cell power semiconductor device (prior art)
600: trench planar MOS cell power semiconductor device (prior art)

The invention claimed is:

1. A power semiconductor device with a first surface and a second surface opposite to each other in a first dimension of three orthogonal dimensions, wherein an emitter electrode is operatively connected to the first surface and a collector electrode is operatively connected to the second surface, comprising:
   a drift layer of a first conductivity type located between the first surface and the second surface, and having a first doping concentration;
   a source region of the first conductivity type operatively connected to the emitter electrode, with a second doping concentration greater than the first doping concentration;
   a first base layer of a second conductivity type, enclosing the source region, and having a third doping concentration;
   a second base layer of the second conductivity type located within the first base layer and extending towards the second surface below the source region, having a fourth doping concentration greater than the third doping concentration, and having at least a region/point operatively connected to the emitter electrode via a contact opening;
   a first gate electrode of a heavily doped polycrystalline layer or a metal-containing layer, arranged on top of the first surface, electrically insulated from the first base layer, the source region and the drift layer by a first insulating layer, a horizontal channel is formable between the emitter electrode, the first source region, the first base layer and the drift layer;
   a plurality of trench recesses, each comprising a second gate electrode and a second insulating layer, the second insulating layer electrically insulating the second gate electrodes from the first base layer, the second base layer, the source region and the drift layer, wherein a first edge of the source region abuts at least one of the trench recesses, wherein the contact opening and the first edge of the source region define a second dimension of the three orthogonal dimensions, and wherein the first base, contact opening, source region and second base layer are shaped with respective stripes dividing at least a same trench recess into separate segments;
   a third insulating layer electrically insulating the emitter electrode from the first gate electrodes; and
   a floating layer of the second conductivity type surrounding the bottom regions of one or more of the trench recesses;
   wherein in a top plane view:
      the source region, the first base layer, the second base layer, and the first gate electrode extend longitudinally in a third dimension of the three orthogonal dimensions;
      the plurality of trench recesses extends in a top plane view at an angle greater than 0 degrees with respect to the third dimension.

2. The power semiconductor device according to claim 1, wherein:
   the first base, source region and second base layer are shaped with respective stripes;
   the trench regions are shaped with respective stripes in an orthogonal direction to the stripes of the first base layer, source region and second base layer, in a top view plane;
   one or more of the stripes of the trench regions are divided into shapes spaced apart from each other by the stripes of the first base layer, source region and second base layer.

3. The power semiconductor device according to claim 1, wherein
   the trench regions are shaped with respective stripes;
   the first base layer, the source region and the second base layer are shaped with respective stripes in an orthogonal direction to the stripes of the trenches, in a top view plane;
   the stripes of the first base layers, source region and second base layer are divided into shapes spaced apart from each other by the stripes of the trenches.

4. The power semiconductor device according to claim 1, wherein the floating layer is not a contiguous layer in between the trench recesses, instead it is shaped as separated segments, each segment covering a bottom of a corresponding trench recess.

5. The power semiconductor device according to claim 1, wherein the first and the plurality of second gate electrodes are electrically connected.

6. The power semiconductor device according to claim 1, wherein at least a portion of the plurality of second gate electrodes are electrically connected to the emitter electrode.

7. The power semiconductor device according to claim 1, wherein at least a portion of the plurality of second gate electrodes are electrically floating.

8. The power semiconductor device according to claim 1, wherein:
   the first gate electrode is formed out of a plurality of electrodes embedded in a plurality of trench recesses, arranged on the first surface and extending in the third dimension in a top plane view; characterized in that, a vertical MOS channel is formable by the first gate electrode between the emitter electrode, the source region, the first base layer, and the drift layer; and,
   a plurality of second gate electrodes being different than the plurality of trench regions, and extending in a dimension oriented at an angle greater than 0 with respect to the third dimension.

9. The power semiconductor device according to claim 1, wherein an enhancement layer of the first conductivity type is arranged between the drift layer and the first base layer, thereby separating the drift layer and the first base layer.

10. The power semiconductor device according to claim 1, wherein the separation distance in the third dimension between adjacent trench recesses is in a range from 5 µm to 0.1 µm, characterized in that, for distances below 0.2 µm, two adjacent vertical channels from opposite second gate electrodes will partially merge.

11. The power semiconductor device according to claim 1, wherein a separation between adjacent trenches trench recesses in the second dimension in a top view extends in a range from 20 µm to 1 µm.

12. The power semiconductor device according to claim 1, wherein the dopant concentration of the floating layer is $1 \times 10^{15}$ cm$^{-3}$ to $1 \times 10^{19}$ cm$^{-3}$.

13. The power semiconductor device according to claim 1, comprising:
   a buffer layer of the first conductivity type with a higher doping concentration than the drift layer, arranged between the drift layer and the collector electrode.

14. The power semiconductor device according to claim 1, comprising:
   a collector layer of the second conductivity type arranged on the second surface between the drift layer and the collector electrode; characterized in that the collector layer is formed before, during, or after a MOS cell process; or comprising:
a buffer layer of the first conductivity type with a higher doping concentration than the drift layer, which buffer layer is arranged on the second surface between the drift layer and the collector electrode; and a collector layer of the second conductivity type, which is arranged on the second surface between the buffer layer and the collector electrode; characterized in that the buffer and collector layers are formed before, during, or after the MOS cell process.

15. The power semiconductor device according to claim 14, comprising:
a reverse conducting type device with a shorted collector layer arranged at the second surface between the collector electrode and the buffer layer, wherein the shorted collector layer is formed by a pattern of first and second conductivity type regions.

16. The power semiconductor device according to claim 1, wherein the power semiconductor device has a stripe layout design or a cellular layout design.

17. The power semiconductor device according to claim 1, wherein:
a first edge of the second base layer is aligned in the second dimension with the first edge of the source region;
a channel is formable on the lateral walls of the trench recesses because of the second base layer that prevents a vertical channel from forming between the emitter electrode, the source region, the first base layer, and the drift layer.

18. The power semiconductor device according to claim 1, wherein:
a first edge of the second base layer is spaced apart in the second dimension from the first edge of the source region, and does not fully overlap the bottom of the source region;
characterized in that, a vertical channel is formable between the emitter electrode, the source region, the first base layer, and the drift layer.

19. A power semiconductor device with a first surface and a second surface opposite to the first surface in a first dimension of the three orthogonal dimensions, wherein an emitter electrode is operatively connected to the first surface and a collector electrode is operatively connected to the second surface, comprising:
a drift layer of a first conductivity type located between the first surface and the second surface, and having a first doping concentration;
a source region of the first conductivity type operatively connected to the emitter electrode, with a second doping concentration greater than the first doping concentration;
a first base layer of a second conductivity type, enclosing the source region, and having a third doping concentration;
a second base layer of the second conductivity type located within the first base layer and extending towards the second surface below the source region, having a fourth doping concentration greater than the third doping concentration, and having at least a region/point operatively connected to the emitter electrode via a contact opening;
a plurality of trench recesses, each comprising a second gate electrode and a second insulating layer, the second insulating layer electrically insulating the second gate electrodes from the first base layer, the second base layer, the source region and the drift layer, wherein a first edge of the source region abuts at least one of the trench recesses, wherein the contact opening and the first edge of the source region define a second dimension of the three orthogonal dimensions, and wherein the first base, contact opening, source region and second base layer are shaped with respective stripes dividing at least a same trench recess into separate segments;
a third insulating layer electrically insulating the emitter electrode from the second gate electrodes; and
a floating layer of the second conductivity type surrounding the bottom regions of one or more of the trench recesses;
wherein the source region, the first base layer, the second base layer, and the first gate electrode extend longitudinally in a top plane view in a third dimension, of the three orthogonal dimensions;
wherein the plurality of trench recesses extends in a top plane view at an angle greater than 0 degrees with respect to the third dimension, and
wherein a channel is formable only on the lateral walls of the trench recesses, between the emitter electrode, the source region, the first base layer, and the drift layer.

* * * * *